(12) United States Patent
Takahashi et al.

(10) Patent No.: US 9,215,811 B2
(45) Date of Patent: Dec. 15, 2015

(54) METHOD FOR MANUFACTURING MULTI-PIECE SUBSTRATE AND MULTI-PIECE SUBSTRATE

(71) Applicants: Michimasa Takahashi, Ogaki (JP); Nobuyuki Naganuma, Ogaki (JP); Toshinobu Asai, Ogaki (JP); Teruyuki Ishihara, Ogaki (JP)

(72) Inventors: Michimasa Takahashi, Ogaki (JP); Nobuyuki Naganuma, Ogaki (JP); Toshinobu Asai, Ogaki (JP); Teruyuki Ishihara, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 360 days.

(21) Appl. No.: 13/629,832

(22) Filed: Sep. 28, 2012

(65) Prior Publication Data

US 2013/0081857 A1 Apr. 4, 2013

(30) Foreign Application Priority Data

Sep. 30, 2011 (JP) .................................. 2011-218739

(51) Int. Cl.
*H05K 3/36* (2006.01)
*H05K 1/00* (2006.01)
*H05K 3/00* (2006.01)

(52) U.S. Cl.
CPC ............ *H05K 3/0097* (2013.01); *H05K 3/0052* (2013.01); *H05K 2201/2072* (2013.01); *H05K 2203/0169* (2013.01);
(Continued)

(58) Field of Classification Search
CPC ... H05K 1/142; H05K 3/4602; H05K 3/4694; H05K 2201/09145; H05K 3/0097; H05K 1/185; H05K 3/0052; H05K 2203/0169; H05K 3/4652; H05K 2201/0909; H05K 2203/173; H05K 3/4644; H05K 3/4679; H05K 1/182; H05K 2201/09036; H05K 2201/09781; H05K 2201/10424; H05K 2203/1469; H05K 2203/1572; H05K 3/303; H05K 3/36

USPC ......... 361/802, 792, 752, 749, 750, 751, 784, 361/803; 29/830, 846, 829, 831, 847, 850; 174/255, 250, 254, 261; 257/786

See application file for complete search history.

(56) References Cited

U.S. PATENT DOCUMENTS 6,512,293 B1 * 1/2003 Chia et al. ...................... 257/730
2010/0101844 A1 * 4/2010 Hasegawa ...................... 174/259

(Continued)

FOREIGN PATENT DOCUMENTS

| CN | 101728584 A | 6/2010 |
| JP | 2009-290081 A | 12/2009 |

(Continued)

*Primary Examiner* — Robert J Hoffberg
*Assistant Examiner* — Michael Matey
(74) *Attorney, Agent, or Firm* — Oblon, McClelland, Maier & Neustadt, L.L.P.

(57) ABSTRACT

A method for manufacturing a multi-piece substrate includes preparing a first frame having a connecting portion to which a first piece substrate is to be connected, forming on a portion of the first piece substrate connected to a second frame a conductive pattern having a contour corresponding to the periphery of the connecting portion of the first frame, irradiating laser along the boundary between the second frame and the conductive pattern on the first piece substrate such that the first piece substrate having a joint portion which engages with the connecting portion of the first frame is detached from the second frame, and fitting the joint portion of the first piece substrate into the connecting portion of the first frame such that the first piece substrate is connected to the first frame.

20 Claims, 34 Drawing Sheets

(52) U.S. Cl.
CPC ... *H05K 2203/107* (2013.01); *H05K 2203/162* (2013.01); *H05K 2203/175* (2013.01); *Y10T 29/49126* (2015.01)

(56) References Cited

U.S. PATENT DOCUMENTS

2011/0096517 A1* 4/2011 Yada et al. .................... 361/752
2011/0315433 A1* 12/2011 Thumser ....................... 174/255

FOREIGN PATENT DOCUMENTS

| JP | 2011-023657 | 2/2011 |
| TW | 201031289 A1 | 8/2010 |
| WO | WO 2011/052493 A1 | 5/2011 |

* cited by examiner

METHOD FOR MANUFACTURING MULTI-PIECE SUBSTRATE AND MULTI-PIECE SUBSTRATE

CROSS-REFERENCE TO RELATED APPLICATIONS

The present application is based upon and claims the benefit of priority from Japanese Patent Application No. 2011-218739, filed Sep. 30, 2011, the entire contents of which are incorporated herein by reference.

BACKGROUND OF THE INVENTION

1. Field of the Invention

The present invention relates to a method for manufacturing a multi-piece substrate and to a multi-piece substrate.

2. Discussion of the Background

During the steps for manufacturing wiring boards, processes such as etching and exposure to light may be conducted on a unit made of integrated piece substrates. For example, Japanese Laid-Open Patent Publication No. 2011-23657 describes a multi-piece substrate which is formed with a frame having spaces to accommodate piece substrates, along with multiple piece substrates detached from a frame different from the above frame. The piece substrates of such a multi-piece substrate are good piece substrates that have cleared a predetermined quality inspection. The contents of Japanese Laid-Open Patent Publication No. 2011-23657 are incorporated herein in the present specification.

SUMMARY OF THE INVENTION

According to one aspect of the present invention, a method for manufacturing a multi-piece substrate includes preparing a first frame having a connecting portion to which a first piece substrate is to be connected, forming on a portion of the first piece substrate connected to a second frame a conductive pattern having a contour corresponding to the periphery of the connecting portion of the first frame, irradiating laser along the boundary between the second frame and the conductive pattern on the first piece substrate such that the first piece substrate having a joint portion which engages with the connecting portion of the first frame is detached from the second frame, and fitting the joint portion of the first piece substrate into the connecting portion of the first frame such that the first piece substrate is connected to the first frame.

According to another aspect of the present invention, a method for manufacturing a multi-piece substrate includes preparing a second piece substrate having a connecting portion to which one of first piece substrates is to be connected, forming on a first connector connecting the first piece substrates to each other a first conductive pattern having a contour corresponding to the periphery of the connecting portion of the second piece substrate, irradiating laser along the boundary of the first conductive pattern and the first connector such that the first piece substrates are detached from each other and that each of the first piece substrates has a joint portion which engages with the connecting portion of the second piece substrate, and fitting into the connecting portion of the second piece substrate the joint portion of one of the first piece substrates such that the one of the first piece substrates is connected to the second piece substrate.

According to yet another aspect of the present invention, a multi-piece substrate has a first frame having a connecting portion, and a first piece substrate having a joint portion engaged with the connecting portion of the first frame and a conductive pattern formed on a periphery portion of the joint portion of the first piece substrate along the periphery of the joint portion of the first piece substrate. The joint portion of the first piece substrate is fitted into the connecting portion of the first frame and has a contour corresponding to the periphery of the connecting portion of the first frame.

According to still another aspect of the present invention, s multi-piece substrate has a first piece substrate, and a second piece substrate having a connecting portion to which the first piece substrate is connected. The first piece substrate has a joint portion fitted into the connecting portion of the second piece substrate, the joint portion of the first piece substrate is formed by detaching from each other multiple piece substrates including the first piece substrate connected by a first connector along the boundary of a first conductive pattern, the first conductive pattern is formed on the first connector and has a contour corresponding to the periphery of the connecting portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
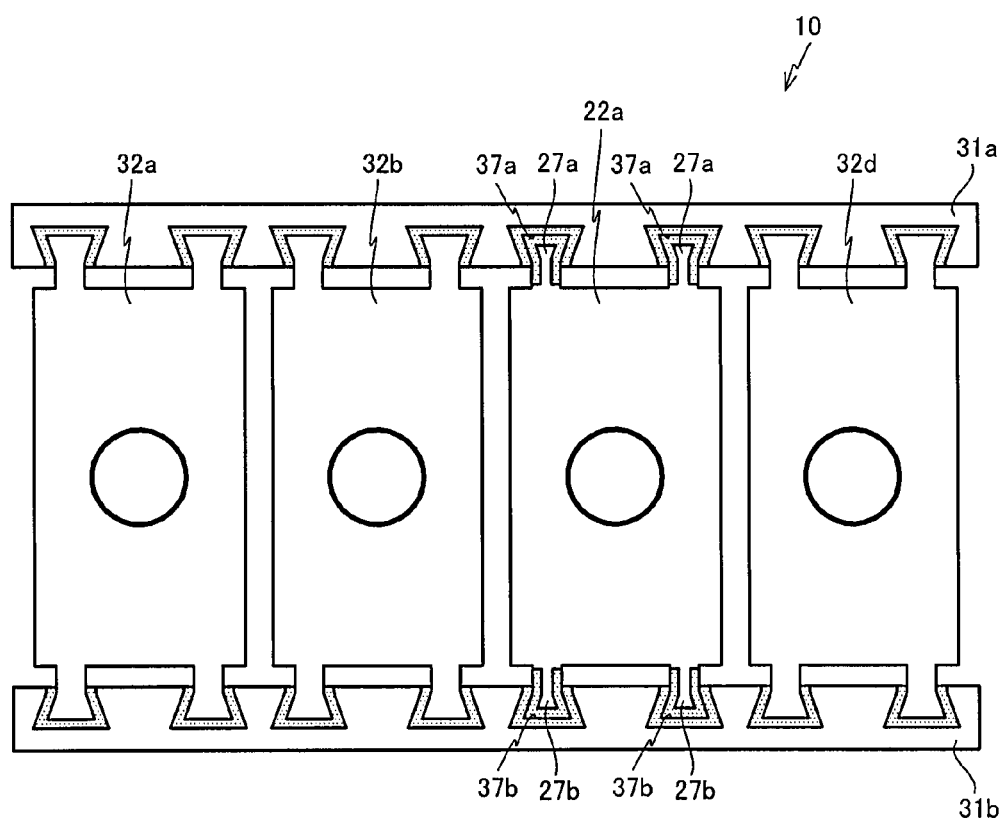
FIG. 1 is a plan view of a multi-piece substrate according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described by referring to the drawings. FIG. 1 is a view showing multi-piece substrate 10 of the present embodiment. Multi-piece substrate 10 has frames (31a, 31b) and piece substrates (22a, 32a, 32b, 32d). Three piece substrates (32a, 32b, 32d) are integrated with frames (31a, 31b). Piece substrate (22a) is manufactured separately from frames (31a, 31b), and then is attached to frames (31a, 31b).

Figure 2:
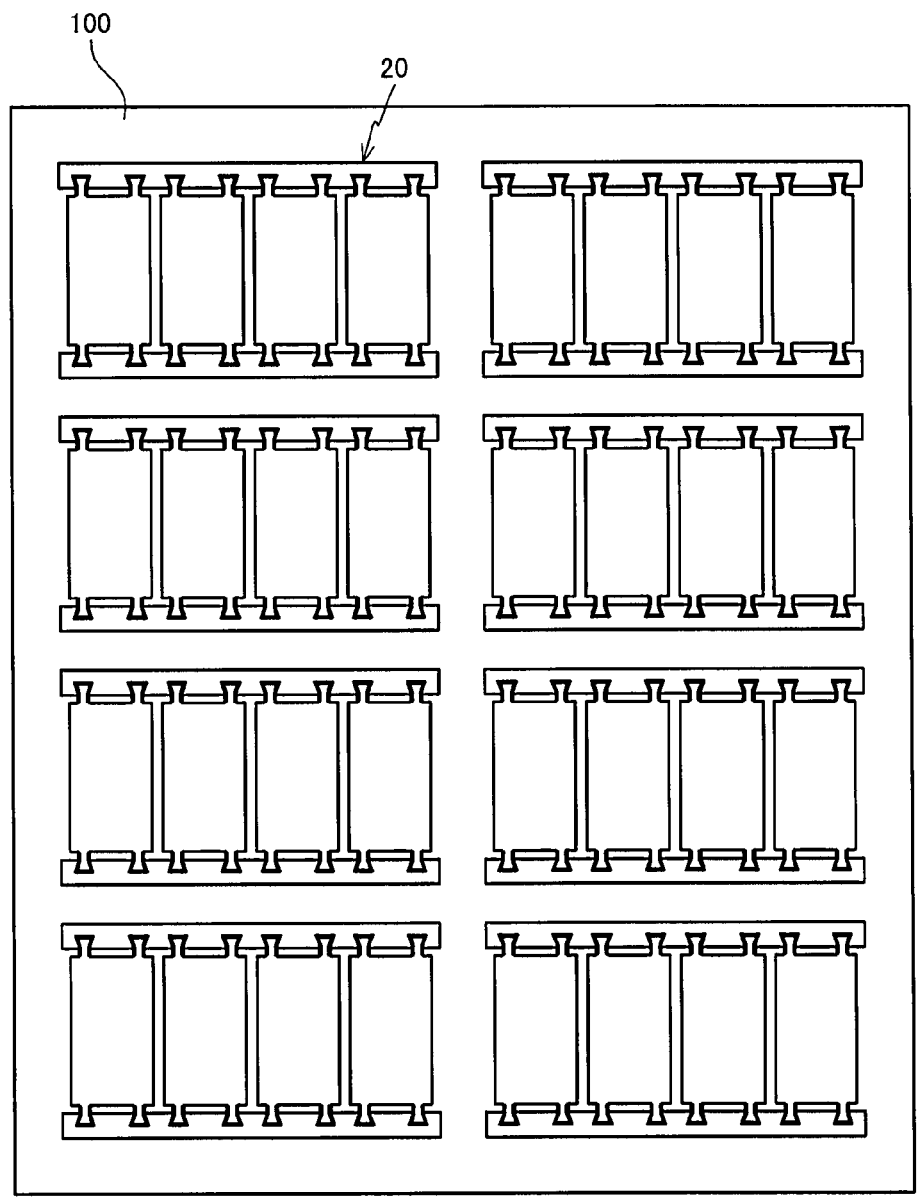
FIG. 2 is a view showing multi-piece substrates formed on a work.
Figure 3:
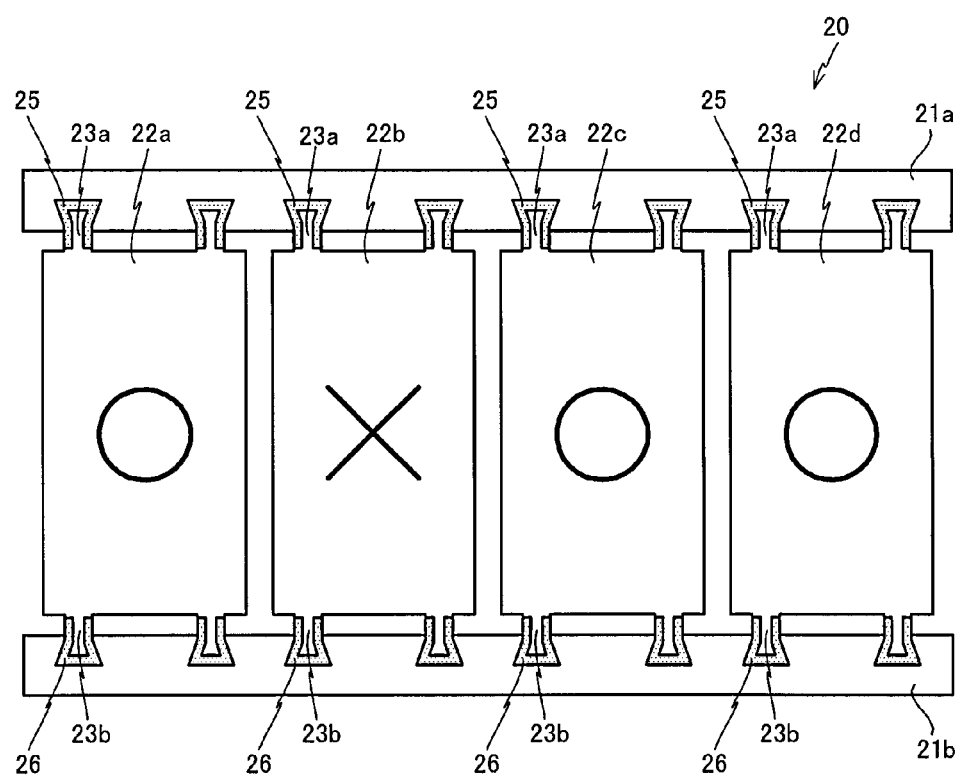
FIG. 3 is a plan view showing a multi-piece substrate.

The following is a description of a method for manufacturing multi-piece substrate 10 according to the present embodiment. First, multiple (eight, for example) multi-piece substrates 20 are formed on work 100 as shown in FIG. 2. Multi-piece substrate 20 has frames (21a, 21b) and four piece substrates (22a, 22b, 22c, 22d), as shown in FIG. 3.

Frames (21a, 21b) are two long, narrow, bar-like portions sandwiching four piece substrates (22a~22d). Frames (21a, 21b) are made of the same material as that of piece substrates (22a~22d), for example, and are integrated with those piece substrates (22a~22d). Frames (21a, 21b) are manufactured using a well-known photolithographic technique, for example.

Piece substrates (22a~22d) are each a rectangular rigid wiring board. Piece substrates (22a~22d) each include circuits for an electronic device, for example. Piece substrates (22a~22d) are manufactured by a widely used method for manufacturing laminated wiring boards, such as laminating prepreg made by impregnating a base material such as glass cloth, nonwoven aramid fiber or paper with uncured epoxy resin, polyimide resin, phenol resin or the like.

Frame (21a) is connected to each of piece substrates (22a~22d) by a pair of supports (23a). Also, frame (21b) is connected to each of piece substrates (22a~22d) by a pair of supports (23b).

Figure 4:
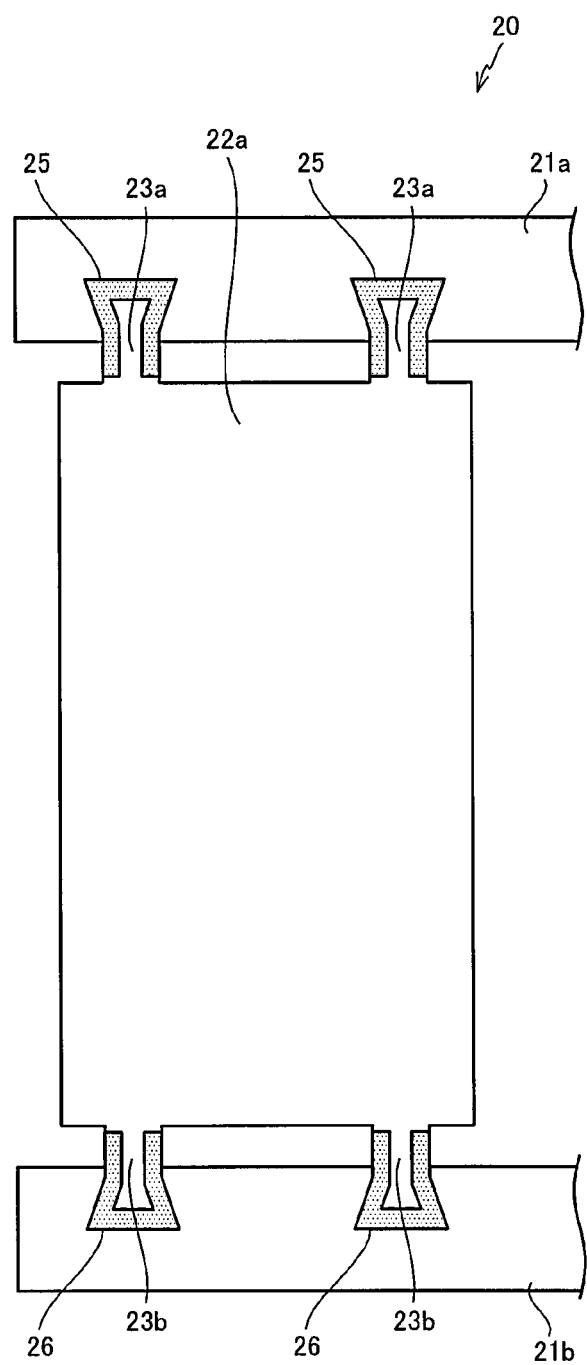
FIG. 4 is a view showing a piece substrate of a multi-piece substrate.

FIG. 4 is an enlarged view of piece substrate (22a). As shown in FIG. 4, conductive pattern 25 patterned in a U shape is formed on support (23a) which connects piece substrate (22a) and frame (21a). Also, conductive pattern 26 patterned in a U shape is formed on support (23b) which connects piece substrate (22a) and frame (21b).

In the same manner, conductive patterns 25 patterned in a U shape are formed on supports (23a) which connect piece substrates (22b~22d) and frame (21a). Also, conductive patterns 26 patterned in a U shape are formed on supports (23b) which connect piece substrates (22b~22d) and frame (21b).

To form conductive patterns (25, 26), electroless plating and electrolytic plating are performed to form plated films on surfaces of supports (23a, 23b), and then those plated films are patterned.

Multi-piece substrate 20 described above is formed on a single work 100. Then, multiple multi-piece substrates 20 formed on work 100 are each detached by an alignment router or the like.

Figure 5:
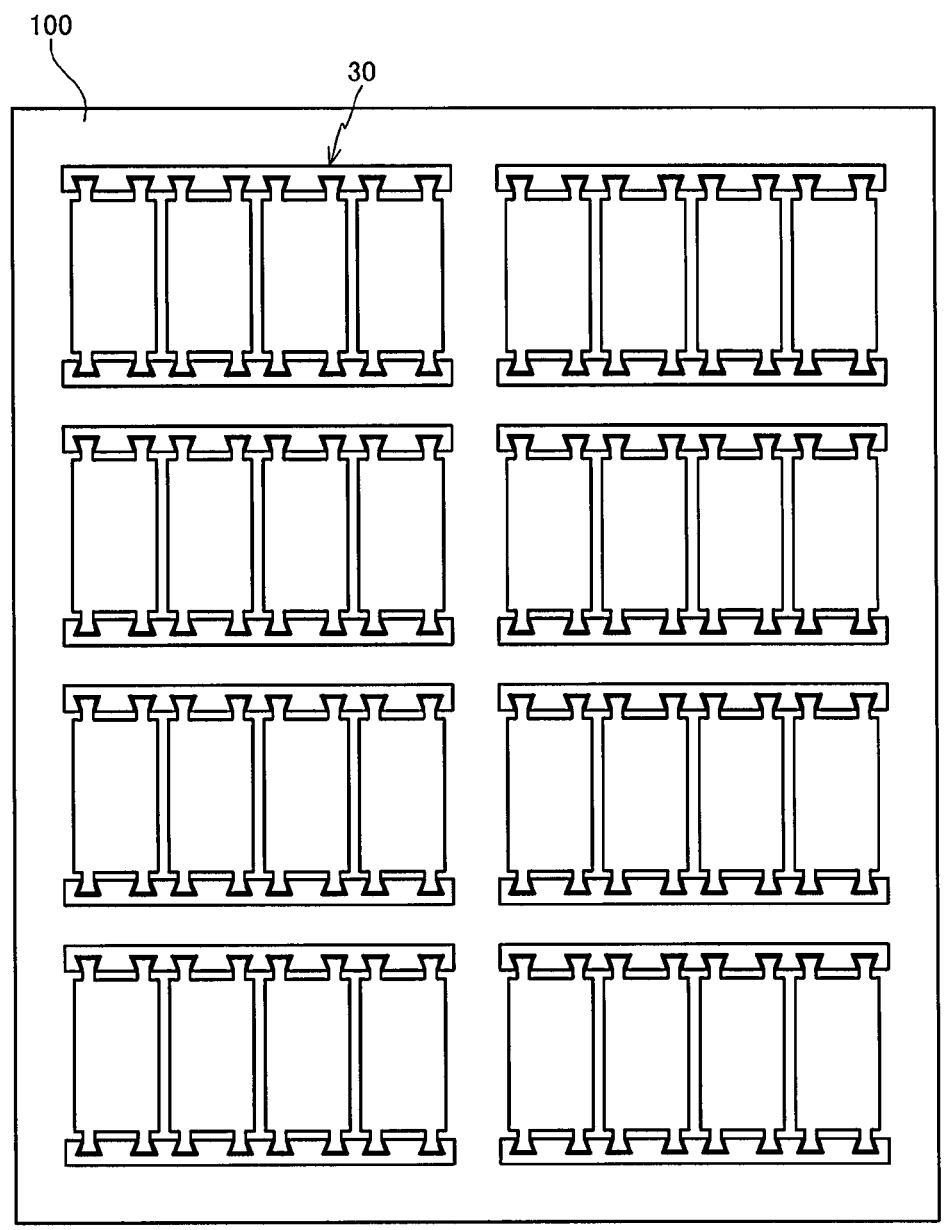
FIG. 5 is a view showing multi-piece substrates formed on a work.
Figure 6:
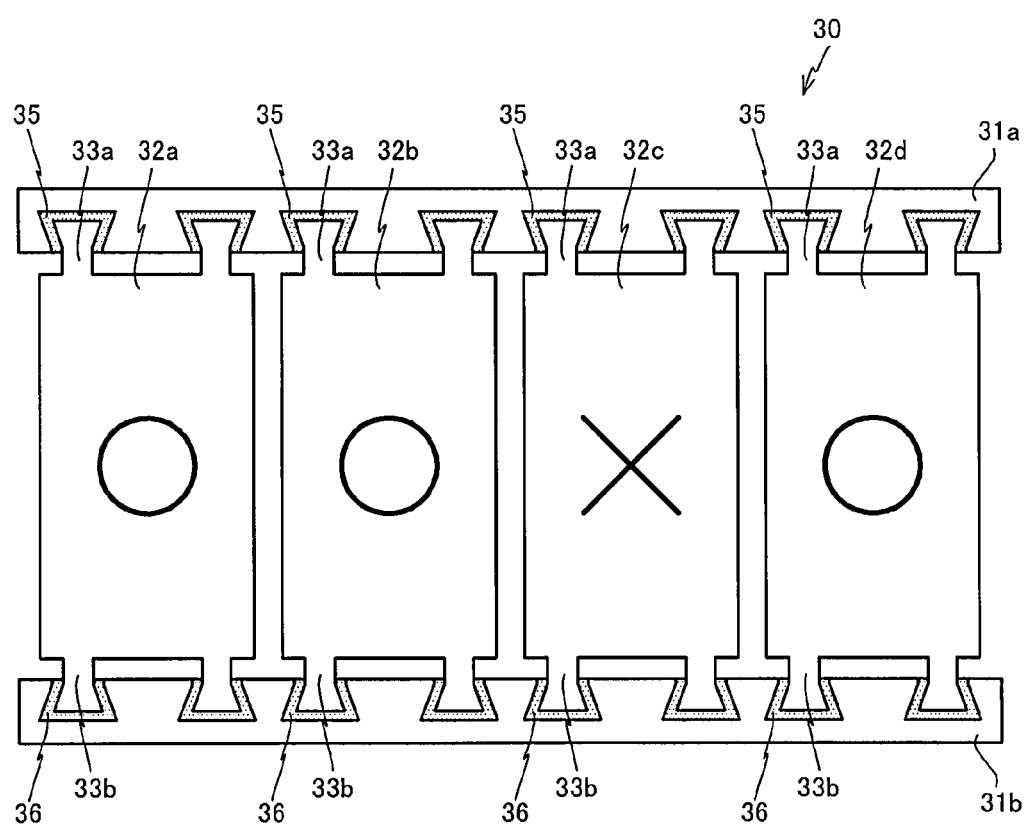
FIG. 6 is a plan view showing a multi-piece substrate.

Multiple (eight, for example) multi-piece substrates 30 are formed on work 100, as shown in FIG. 5. Multi-piece substrate 30 has frames (31a, 31b) and four piece substrates (32a, 32b, 32c, 32d), as shown in FIG. 6.

Frames (31a, 31b) are two long, narrow, bar-like portions sandwiching four piece substrates (32a~32d). Frames (31a, 31b) are made of the same material as that of piece substrates (32a~32d), for example, and are integrated with those piece substrates (32a~32d). Frames (31a, 31b) are manufactured using a well-known photolithographic technique, for example.

Piece substrates (32a~32d) are each a rectangular rigid wiring board, the same as piece substrates (22a~22d) described above.

Frame (31a) is connected to each of piece substrates (32a~32d) by a pair of supports (33a). Also, frame (31b) is connected to each of piece substrates (32a~32d) by a pair of supports (33b).

Figure 7:
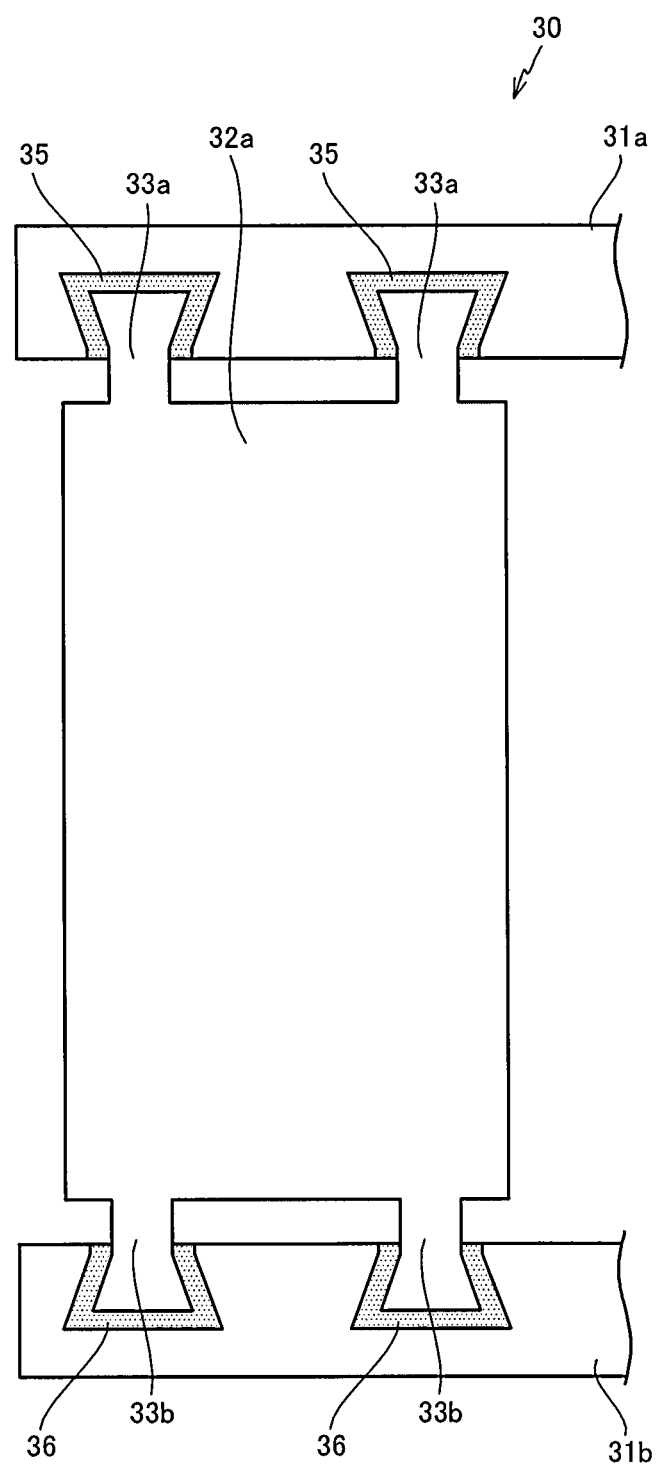
FIG. 7 is a view showing a piece substrate of a multi-piece substrate.

FIG. 7 is an enlarged view of piece substrate (32a). As shown in FIG. 7, conductive pattern 35 patterned in a U shape is formed on support (33a) which connects piece substrate (32a) and frame (31a). Also, conductive pattern 36 patterned in a U shape is formed on support (33b) which connects piece substrate (32a) and frame (31b).

In the same manner, conductive patterns 35 patterned in a U shape are formed on supports (33a) which connect piece substrates (32b~32d) and frame (31a). Also, conductive patterns 36 patterned in a U shape are formed on supports (33b) which connect piece substrates (32b~32d) and frame (31b).

To form conductive patterns (35, 36), electroless plating and electrolytic plating are performed to form plated films on surfaces of supports (33a, 33b), and then those plated films are patterned. The inner contour of conductive pattern 35 corresponds to the outer contour of conductive pattern 25 shown in FIG. 4, for example. Also, the inner contour of conductive pattern 36 corresponds to the outer contour of conductive pattern 26.

Multi-piece substrate 30 described above is formed on a single work 100. Then, multiple multi-piece substrates 30 formed on work 100 are each detached using an alignment router or the like.

Figure 8:
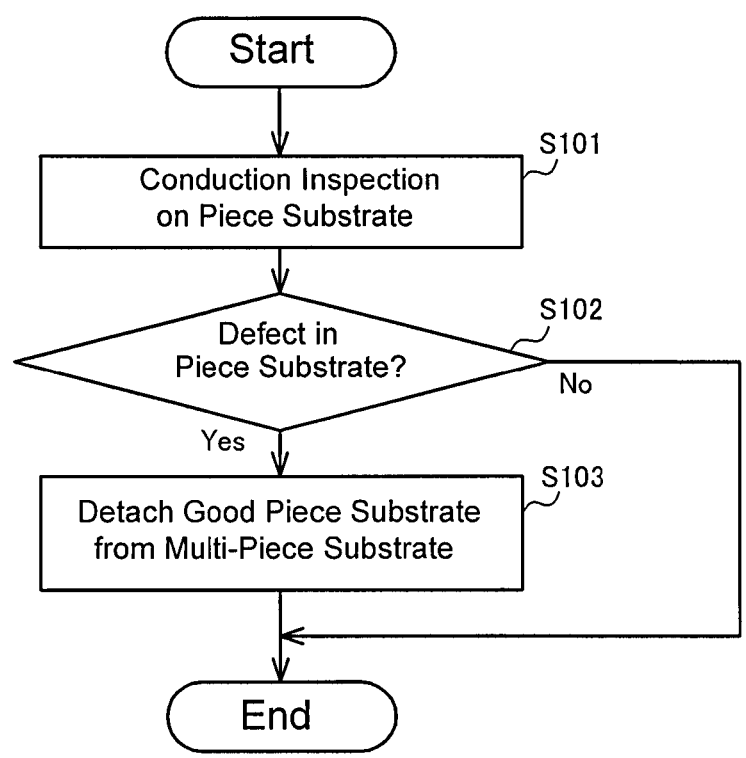
FIG. 8 is a view showing a series of processes on a multi-piece substrate.

A series of processes shown in FIG. 8 is performed on multi-piece substrate 20.

First, in step (S101), a conduction inspection is performed on each of piece substrates (22a, 22b, 22c, 22d) of multi-piece substrate 20. Then, in step (S102), it is determined whether or not any defective piece substrate is found among piece substrates (22a~22d). If the conduction inspection finds that all the piece substrates have no defects and are good (step (S102): No), the process in FIG. 8 is finished. On the other hand, if any defects are found in a piece substrate (step (S102): Yes), the process is required to proceed to step (S103). Here, piece substrate (22b) is cited as an example which is defective.

In step (S103), aside from a defective piece substrate, good piece substrates are detached from multi-piece substrate 20. In particular, aside from defective piece substrate (22b), good piece substrates (22a, 22c, 22d) are detached using a laser. A $CO_2$ laser, for example, may be used for such a laser.

Figure 9:
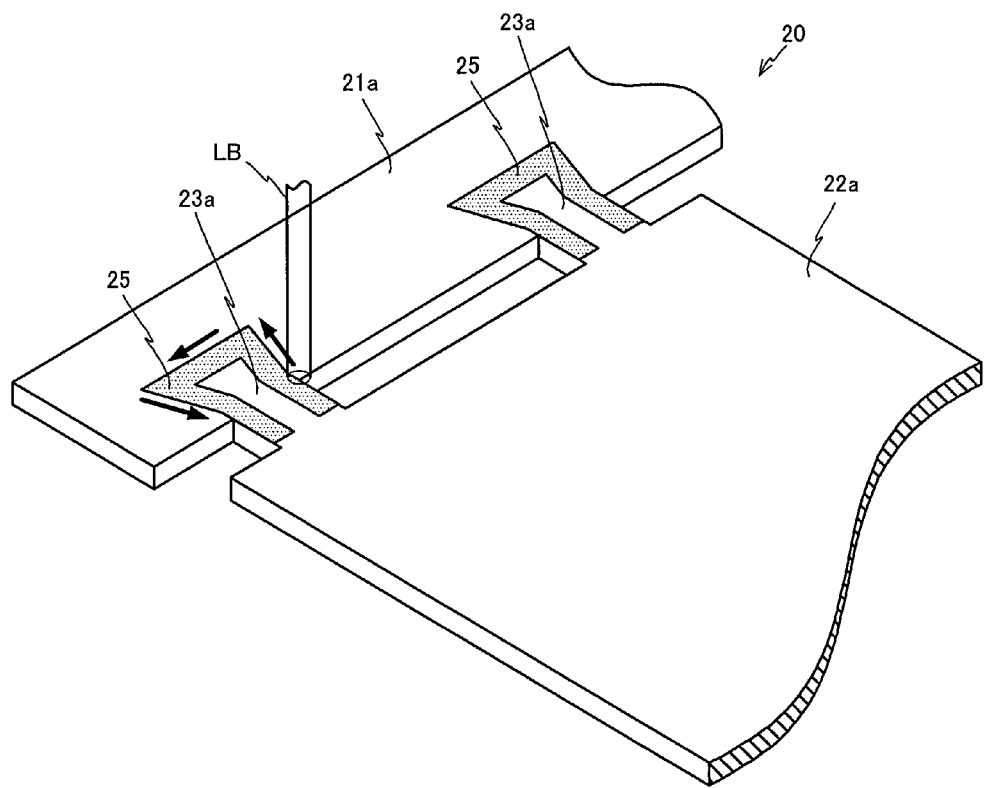
FIG. 9 is a view illustrating a process to detach a piece substrate from a frame.

FIG. 9 shows how to detach piece substrate (22a) from frame (21a). As shown in FIG. 9, laser beam (LB) is irradiated at the boundary of the outer side of conductive pattern 25 and frame (21a) when piece substrate (22a) is detached from frame (21a). During that time, the beam spot of laser beam (LB) is formed to cover conductive pattern 25 and frame (21a). Then, laser beam (LB) is moved relative to multi-piece substrate 20 so that the beam spot of laser beam (LB) moves along the arrows on the boundary of conductive pattern 25 and frame (21a). Accordingly, portions of support (23a) that are not covered by conductive pattern 25 are dissolved, and piece substrate (22a) is detached from frame (21a).

When piece substrate (22a) is detached from multi-piece substrate 20, the above process is conducted on a pair of supports (23a) connecting frame (21a) and piece substrate (22a) as well as on a pair of supports (23b) connecting frame (21b) and piece substrate (22a). In doing so, piece substrate (22a) is detached from multi-piece substrate 20.

Figure 10:
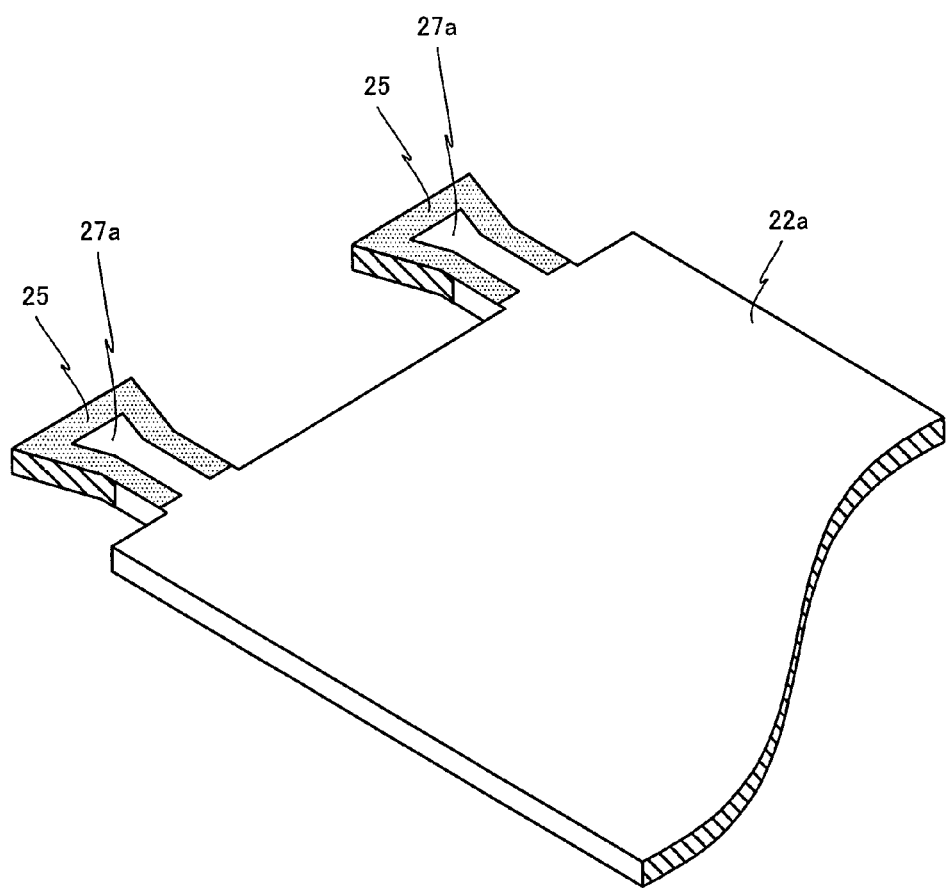
FIG. 10 is a view showing joints of the piece substrate detached from the frame.

FIG. 10 shows piece substrate (22a) detached from multi-piece substrate 20. As shown in FIG. 10 and FIG. 1, a pair of supports (23a), which remain with detached piece substrate (22a) and are edged with conductive patterns 25, become joints (27a) to be fitted into recesses (37a) formed in frame (31a) as shown in FIG. 1. Also, a pair of supports (23b), which remain with detached piece substrate (22a) and are edged with conductive patterns 26, become joints (27b) to be fitted into recesses (37b) formed in frame (31b) as shown in FIG. 1.

As shown in FIG. 10, the contour of joint (27a) formed for piece substrate (22a) substantially corresponds to the outer contour of conductive pattern 25. Side surfaces of joint (27a) are made planar with a relatively high degree of flatness. Also, the contour of joint (27b) formed for piece substrate (22a) substantially corresponds to the outer contour of conductive pattern 26. Side surfaces of support (23b) are made planar with a relatively high degree of flatness.

Figure 11:
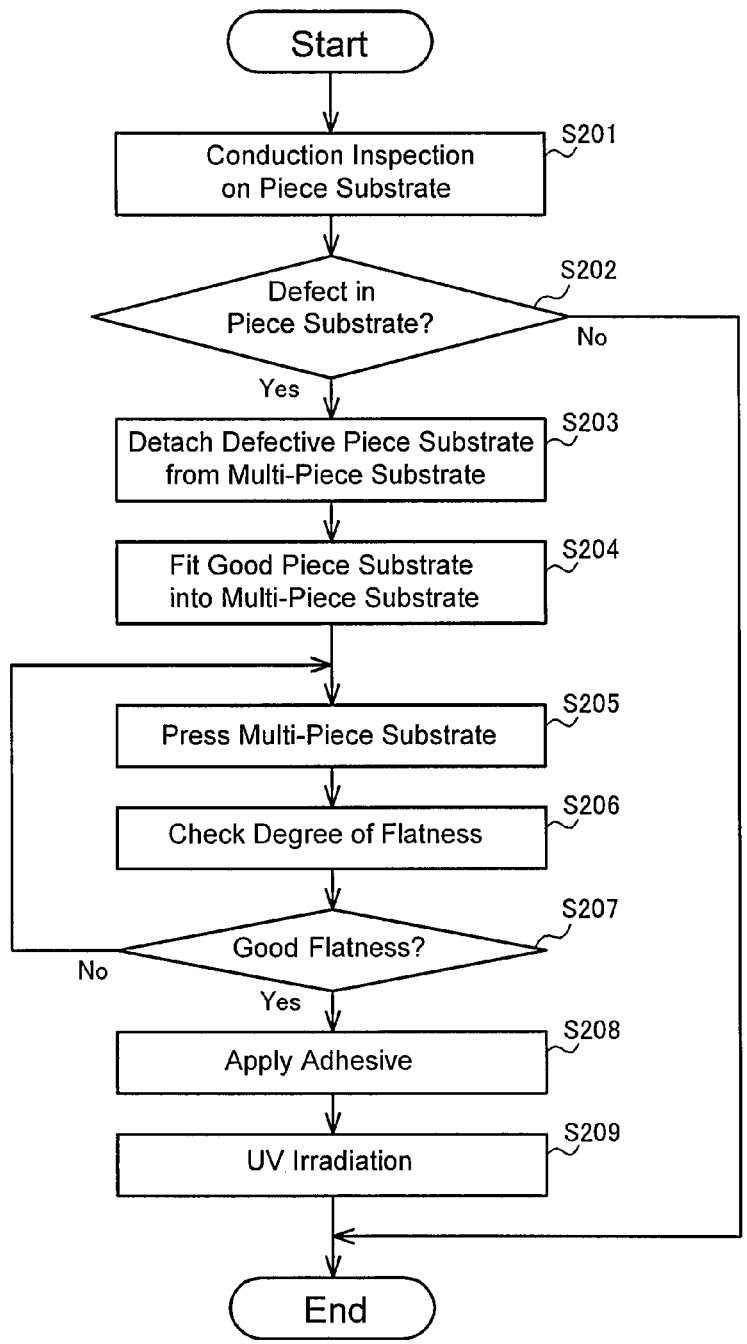
FIG. 11 is a view showing a series of processes on a multi-piece substrate.

By repeating the process the same as when piece substrate (22a) is detached from multi-piece substrate 20, piece substrates (22c, 22d) except for piece substrate (22b) are detached one by one from multi-piece substrate 20. When detaching good piece substrates other than a defective piece substrate is finished, the process involving multi-piece substrate 20 is finished. Then, a series of processes shown in FIG. 11 is conducted on multi-piece substrate 30.

First, in step (S201), a conduction inspection is performed on each of piece substrates (32a, 32b, 32c, 32d) of multi-piece substrate 30. Then, in step (S202), it is determined whether or not any defective piece substrate is found among piece substrates (32a~32d). If the conduction inspection finds that all the piece substrates have no defects and are good (step (S202): No), the process in FIG. 11 is finished. On the other hand, if any defect is found in a piece substrate (step (S202): Yes), the process is required to proceed to step (S203). Here, piece substrate (32c) is cited as an example which is defective.

Figure 12:
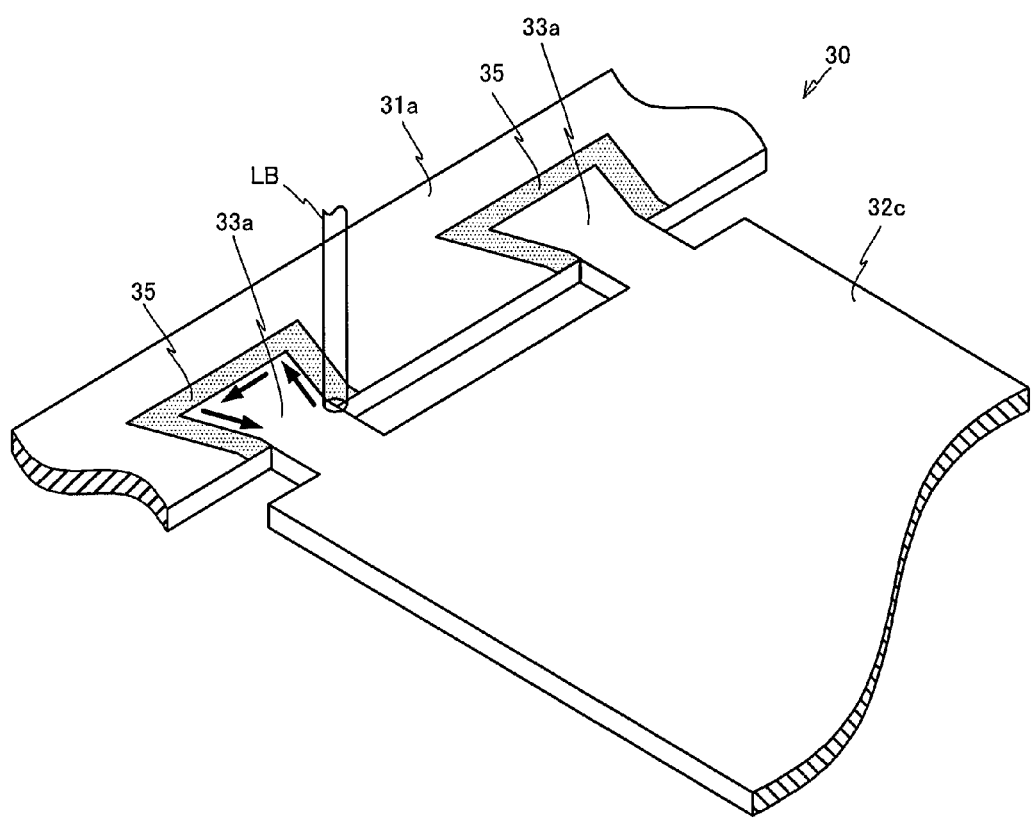
FIG. 12 is a view illustrating a process to detach a piece substrate from a frame.

In step (S203), a defective piece substrate is detached from multi-piece substrate 30. In particular, defective piece substrate (32c) is detached using a laser. FIG. 12 is a view showing how to detach piece substrate (32c) from frame (31a).

As shown in FIG. 12, laser beam (LB) is irradiated at the boundary of the inner side of conductive pattern 35 and frame (31a) when piece substrate (32c) is detached from frame (31a). During that time, the beam spot of laser beam (LB) is formed to cover conductive pattern 35 and frame (31a). Then, laser beam (LB) is moved relative to multi-piece substrate 30 so that the beam spot of laser beam (LB) moves on the boundary of conductive pattern 35 and frame (31a) along the arrows. Accordingly, portions of support (33a) that are not covered by conductive pattern 35 are dissolved, and piece substrate (32c) is detached from frame (31a).

When piece substrate (32c) is detached from multi-piece substrate 30, the above process is conducted on a pair of supports (33a) connecting frame (31a) and piece substrate (32c) as well as on a pair of supports (33b) connecting frame (31b) and piece substrate (32c). In doing so, piece substrate (32c) is detached from multi-piece substrate 30.

Figure 13:
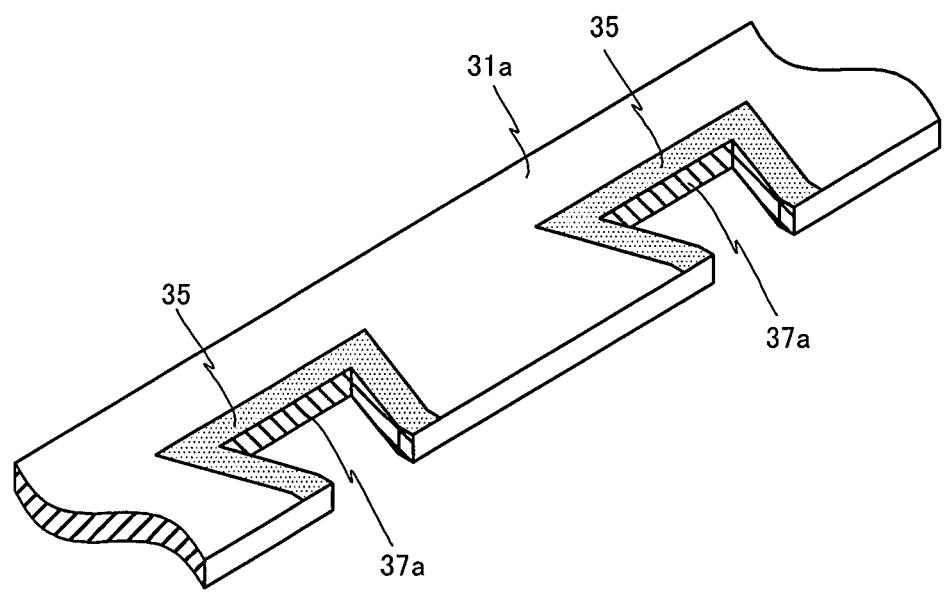
FIG. 13 is a view showing recesses formed in the frame.

FIG. 13 shows frame (31a) after piece substrate (32c) has been detached. As shown in FIG. 13 and FIG. 1, a pair of recesses (37a) and a pair of recesses (37b) are formed in frame (31a) when piece substrate (32c) is detached. The contours of recesses (37a, 37b) substantially correspond to the inner contours of conductive patterns (35, 36). Also, the inner-wall surfaces of recesses (37a, 37b) are made planar with a relatively high degree of flatness. Then, recesses (37a, 37b) become connecting portions to which joints (27a, 27b) of a piece substrate are connected.

When a defective piece substrate has been detached, any good piece substrate detached from multi-piece substrate 20 is fitted into multi-piece substrate 30 in next step (S204). For example, as shown in FIG. 14, when piece substrate (32c) is detached from multi-piece substrate 30, piece substrate (22a) is fitted into the position where piece substrate (32c) was located.

Figure 14:
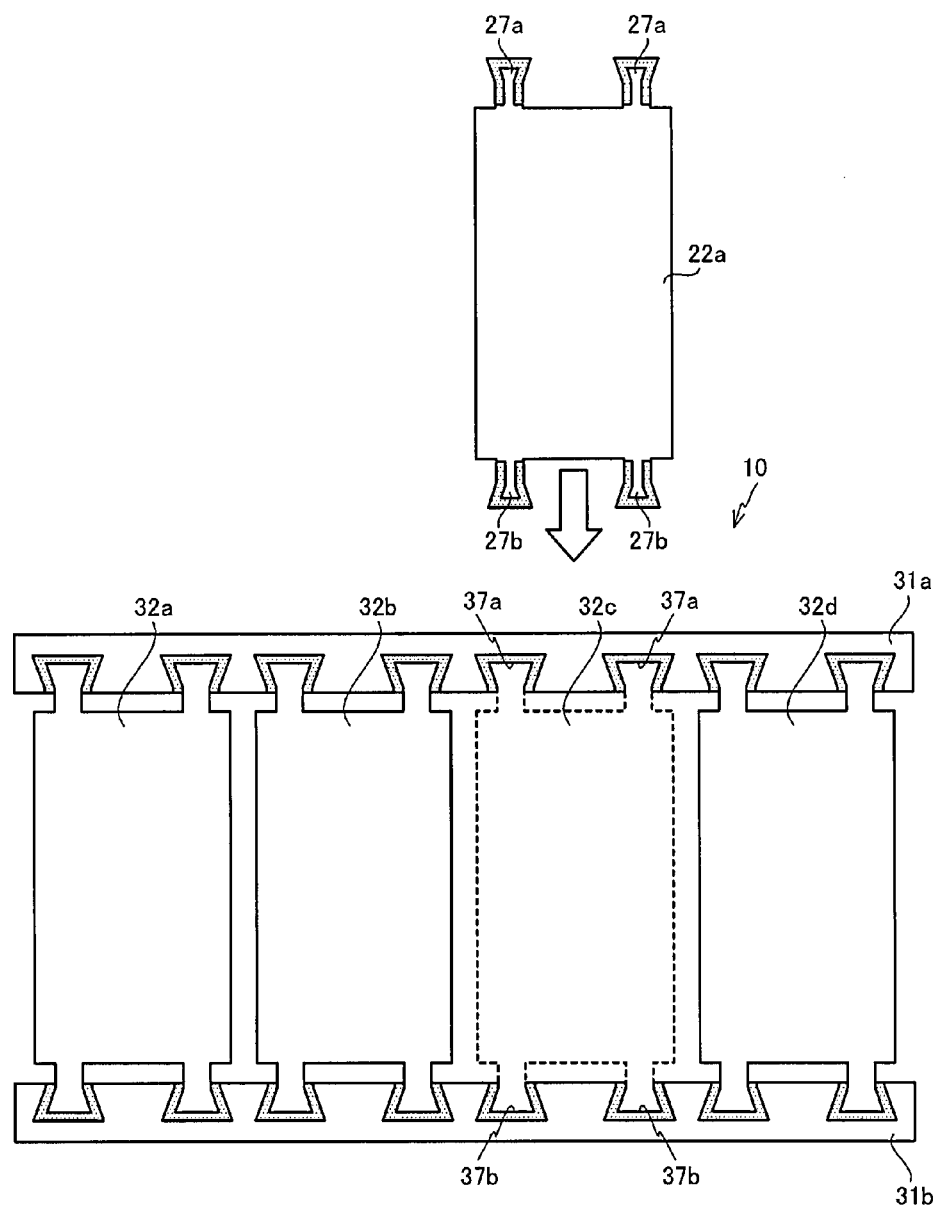
FIG. 14 is a view illustrating a process to fit a piece substrate into a multi-piece substrate.
Figure 15:
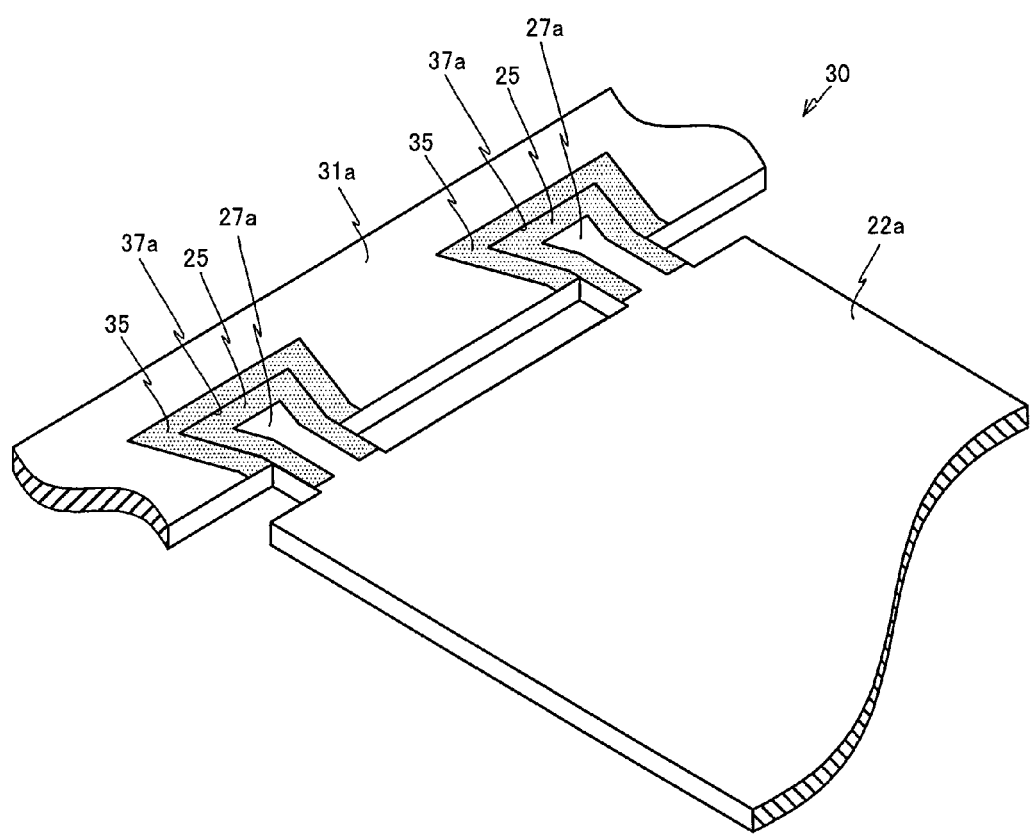
FIG. 15 is a view illustrating a process to fit a piece substrate into a multi-piece substrate.

As shown in FIGS. 14 and 15, a pair of joints (27a) formed for piece substrate (22a) are respectively fitted into recesses (37a) in frame (31a) of multi-piece substrate 30.

Then, a pair of joints (27b) formed for piece substrate (22a) are respectively fitted into recesses (37b) in frame (31b) of multi-piece substrate 30. In doing so, frames (31a, 31b) and piece substrate (22a) are integrated as shown in FIG. 1.

Figure 16:
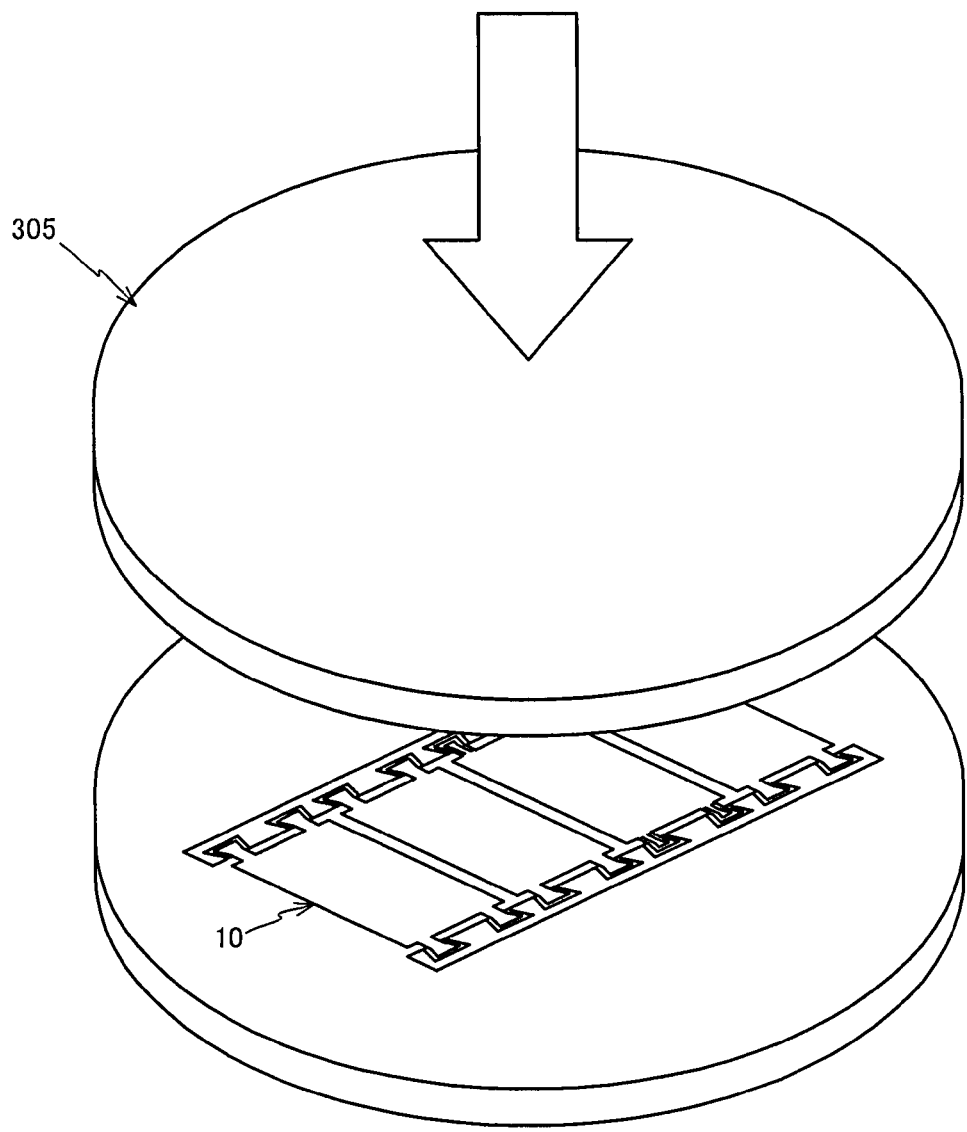
FIG. 16 is a view illustrating a process for pressing a multi-piece substrate with fitted piece substrates.

In step (S205), using pressing device 305, multi-piece substrate 10 is pressed to flatten surfaces of the portions where frames (31a, 31b) of multi-piece substrate 10 are connected with joints (27a, 27b) formed for piece substrate (22a) as shown in FIG. 16.

Figure 17:
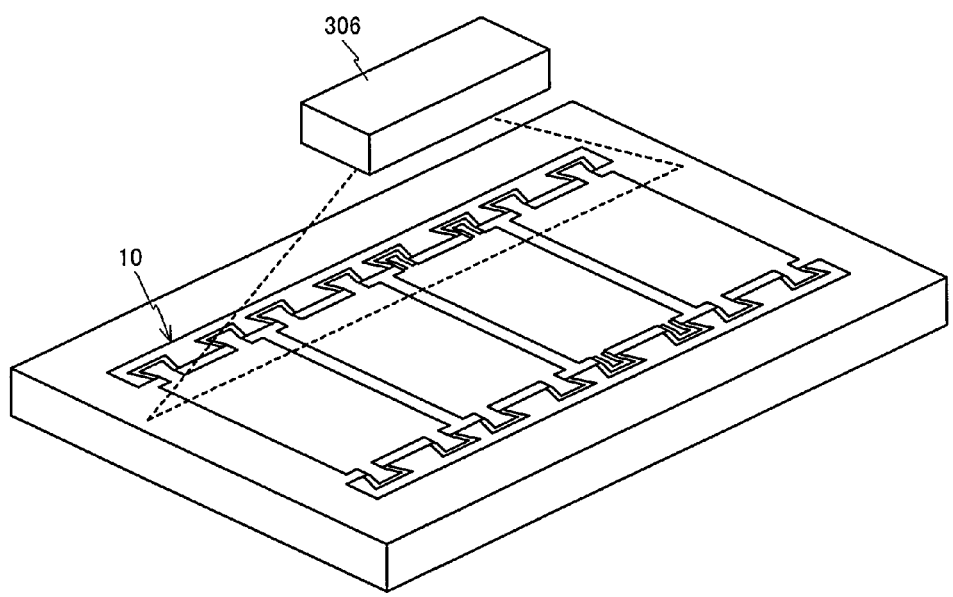
FIG. 17 is a view illustrating an inspection to check the degree of flatness of a multi-piece substrate with fitted piece substrates.

In step (S206), using laser displacement gauge 306, the degree of flatness of multi-piece substrate 10 is inspected as shown in FIG. 17. Then, in step (S207), it is determined whether or not the degree of flatness is excellent. When the degree of flatness is found not to be excellent in step (S207) (step (S207): No), it is required to go back to step (S205) and repeat the processes in steps (S205~S207).

On the other hand, if the degree of flatness is found to be excellent in step (S207) (step (S207): Yes), a UV-curable adhesive is applied in step (S208) at the boundaries between recesses (37a, 37b) formed in frames (31a, 31b) of multi-piece substrate 10 and joints (27a, 27b) formed for piece substrate (22a). The adhesive is filled between the inner-wall surfaces of recesses (37a, 37b) formed in frames (31a, 31b) of multi-piece substrate 10 and joints (27a, 27b) formed for piece substrate (22a).

In step (S209), UV rays are irradiated at frames (31a, 31b) and joints (27a, 27b) formed for piece substrate (22a). By doing so, the applied adhesive is cured and frames (31a, 31b) and piece substrate (22a) are firmly adhered. Accordingly, multi-piece substrate 10 shown in FIG. 1 is completed.

As described above, in the present embodiment, U-shaped conductive patterns (25, 26) are formed on supports (23a, 23b) which connect frames (21a, 21b) and piece substrates (22a~22d) of multi-piece substrate 20 as shown in FIG. 3. Also, as shown in FIG. 6, U-shaped conductive patterns (35, 36) are formed on supports (33a, 33b) which connect frames (31a, 31b) and piece substrates (32a~32d) of multi-piece substrate 30. In addition, the outer contours of conductive patterns (25, 26) formed on supports (23a, 23b) of multi-piece substrate 20 correspond to the inner contours of conductive patterns (35, 36) formed on supports (33a, 33b) of multi-piece substrate 30.

Therefore, cutting errors when detaching piece substrates (22a~22d) from multi-piece substrate 20 and cutting errors when detaching piece substrates (32a~32d) from multi-piece substrate 30 are suppressed from occurring. Namely, the contours of joints (27a) formed for piece substrates (22a~22d) when piece substrates (22a~22d) are detached from multi-piece substrate 20 are shaped substantially corresponding to the contours of recesses (37a, 37b) formed in frames (31a, 31b) of multi-piece substrate 30 when piece substrates (32a~32d) are detached from multi-piece substrate 30.

Accordingly, when defective piece substrate (32c) is detached from among piece substrates (32a~32d) of multi-piece substrate 30, for example, and good piece substrate (22a) which was detached from multi-piece substrate 20 is attached instead to multi-piece substrate 30, joints (27a, 27b) of piece substrate (22a) detached from multi-piece substrate 20 are fitted into recesses (37a, 37b) formed in frames (31a, 31b) of multi-piece substrate 30 without leaving any space. Therefore, good piece substrate (22a) can be positioned accurately where defective piece substrate (32c) was located. As a result, building up conductive patterns, mounting an electronic component and so forth are conducted accurately on each piece substrate of a multi-piece substrate with a replaced piece substrate.

In the present embodiment, the contours of joints (27a) formed for piece substrates (22a~22d) when piece substrates (22a~22d) are detached from multi-piece substrate 20 are shaped substantially corresponding to the contours of recesses (37a, 37b) formed in frames (31a, 31b) of multi-piece substrate 30 when piece substrates (32a~32d) are detached from multi-piece substrate 30. Accordingly, when a piece substrate is replaced, joints (27a, 27b) of piece substrate (22a) detached from multi-piece substrate 20 are fitted into recesses (37a, 37b) formed in frames (31a, 31b) of multi-piece substrate 30 without leaving any space. Therefore, even when an adhesive is not used, piece substrates are firmly attached to frames (31a, 31b) to a certain degree by caulking. If an adhesive is used, piece substrate (22a) is even more firmly attached to frames (31a, 31b).

Second Embodiment

A second embodiment of the present invention is described with reference to the drawings. Here, the same reference numbers are used for the same or similar structures as those in the first embodiment. Coordinates using axis X and axis Y that cross each other at right angles are used if required in a description.

Figure 18:
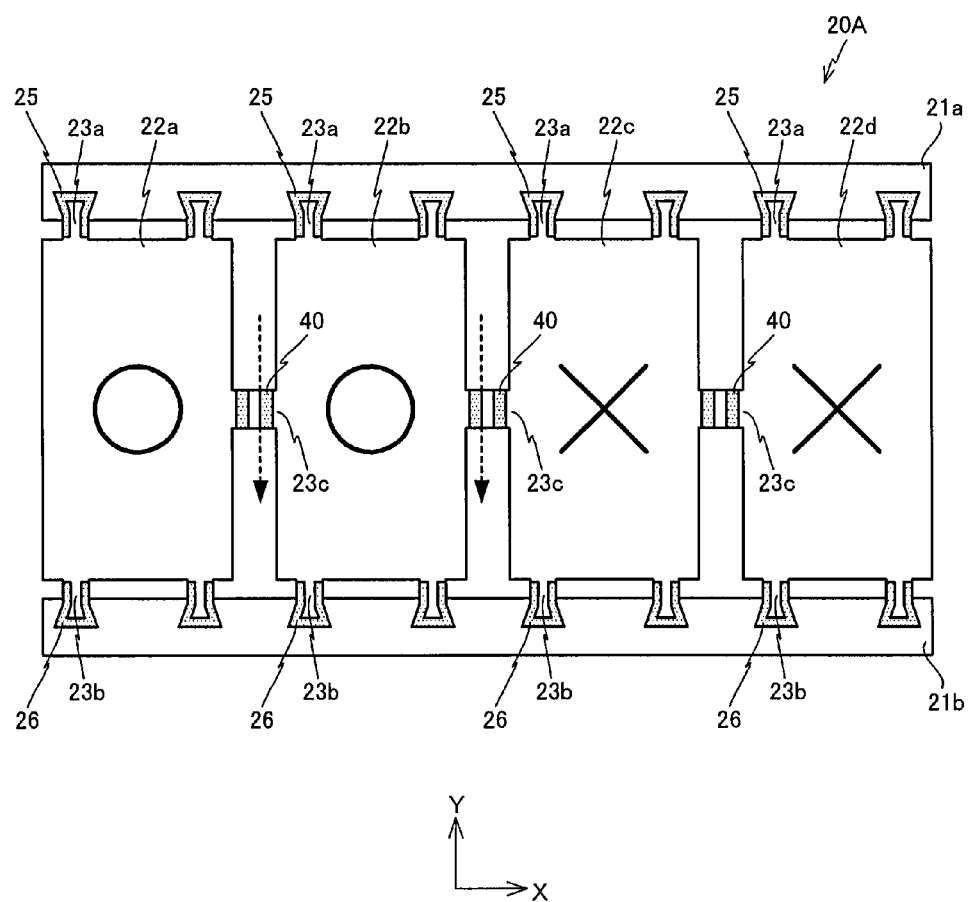
FIG. 18 is a view showing a multi-piece substrate according to a second embodiment of the present invention.

FIG. 18 is a view showing multi-piece substrate (20A) according to the second embodiment. Multi-piece substrate (20A) is different from multi-piece substrate 20 of the first embodiment in that piece substrates (22a~22d) of the multi-piece substrate are connected by connectors (23c) in direction X.

As shown in FIG. 18, piece substrates (22a~22d) of multi-piece substrate (20A) are each detached from work 100 while a piece substrate is connected to its adjacent piece substrate by connector (23c). On a surface of each connector (23c) connecting piece substrates (22a~22d) of multi-piece substrate (20A), a pair of conductive patterns 40 are formed in parallel position while sandwiching the center of connector (23c). Such a pair of conductive patterns 40 have the same shape and size as each other, and are separated from each other at a distance equal to the width of conductive patterns 40.

To form conductive patterns 40, electroless plating and electrolytic plating are performed on surfaces of connectors (23c) to form plated films, and then the plated films are patterned to make rectangular shapes with their longitudinal sides set in direction Y. Conductive patterns 40 are formed to cross connectors (23c) in direction Y.

Figure 19:
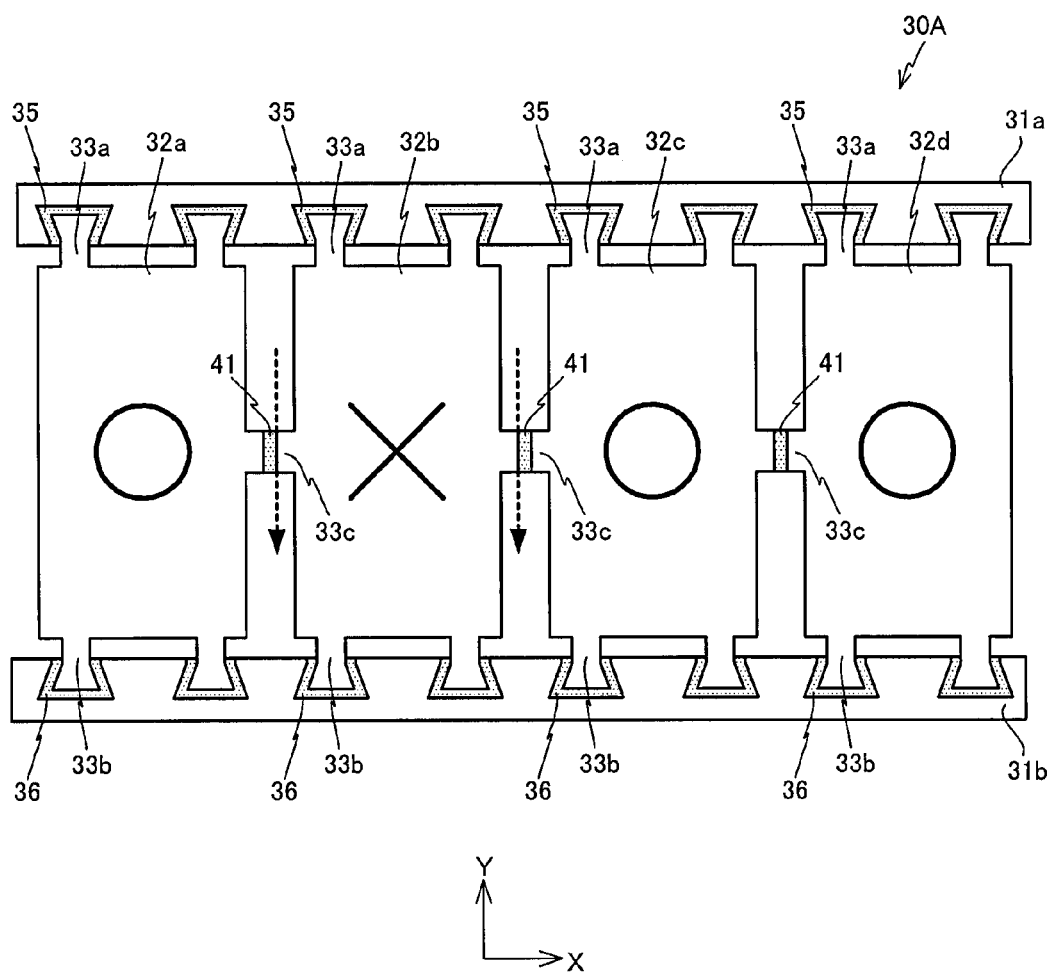
FIG. 19 is a view showing a multi-piece substrate according to the second embodiment of the present invention.

FIG. 19 is a view showing multi-piece substrate (30A) according to the second embodiment. Because piece substrates (32a~32d) of multi-piece substrate (30A) are connected by connectors (33c) in direction X, it is different from multi-piece substrate 30 of the first embodiment.

As shown in FIG. 19, piece substrates (32a~32d) of multi-piece substrate (30A) are detached from work 100 while each piece is connected to an adjacent piece substrate by connector (33c). Conductive pattern 41 is formed on a surface of each connector (33c) connecting piece substrates (32a~32d) of multi-piece substrate (30A) to each other. Conductive pattern 41 has the same shape and size as conductive pattern 40. Conductive pattern 41 is positioned in the center of connector (33c) to divide connector (33c) into two.

To form conductive patterns 41, electroless plating and electrolytic plating are performed on surfaces of connectors (33c) to form plated films, and then the plated films are patterned to make rectangular shapes with their longitudinal sides set in direction Y. Conductive patterns 41 are formed to cross connectors (33c) in direction Y.

Multi-piece substrate (20A) and multi-piece substrate (30A) formed as above are given a conduction inspection after they are detached from the work. If the conduction inspection finds any defective piece substrate among piece substrates (32a~32d) of multi-piece substrate (30A), the defective piece substrate is replaced with a good piece substrate of multi-piece substrate (20A).

For example, when piece substrates (22c, 22d) are found defective in multi-piece substrate (20A) as shown in FIG. 18, and when piece substrate (32b) is found defective in multi-piece substrate (30A) as shown in FIG. 19, defective piece substrate (32b) is detached from multi-piece substrate (30A), and good piece substrate (22b) detached from multi-piece substrate (20A) is fitted into multi-piece substrate (30A) as a replacement. In the following, a process for replacing piece substrates is described.

First, piece substrate (22b) is detached from multi-piece substrate (20A). When detaching piece substrate (22b), piece substrate (22b) is detached from piece substrates (22a, 22c) on both of its sides in such a way that, of a pair of conductive patterns 40, conductive pattern 40 positioned closer to piece substrate (22b) will not be detached from piece substrate (22b) as shown in FIG. 20.

In particular, as the arrows in FIG. 18 show, a laser beam is moved relative to multi-piece substrate (20A) so that, of a pair of conductive patterns 40, the beam spot of the laser beam moves along the outer edge of the conductive pattern 40 that is positioned closer to piece substrate (22b). By setting so, the beam spot of the laser beam moves along the arrows in FIG. 18, and piece substrate (22b) is detached from piece substrates (22a, 22c) positioned on both of its sides.

Figure 20:
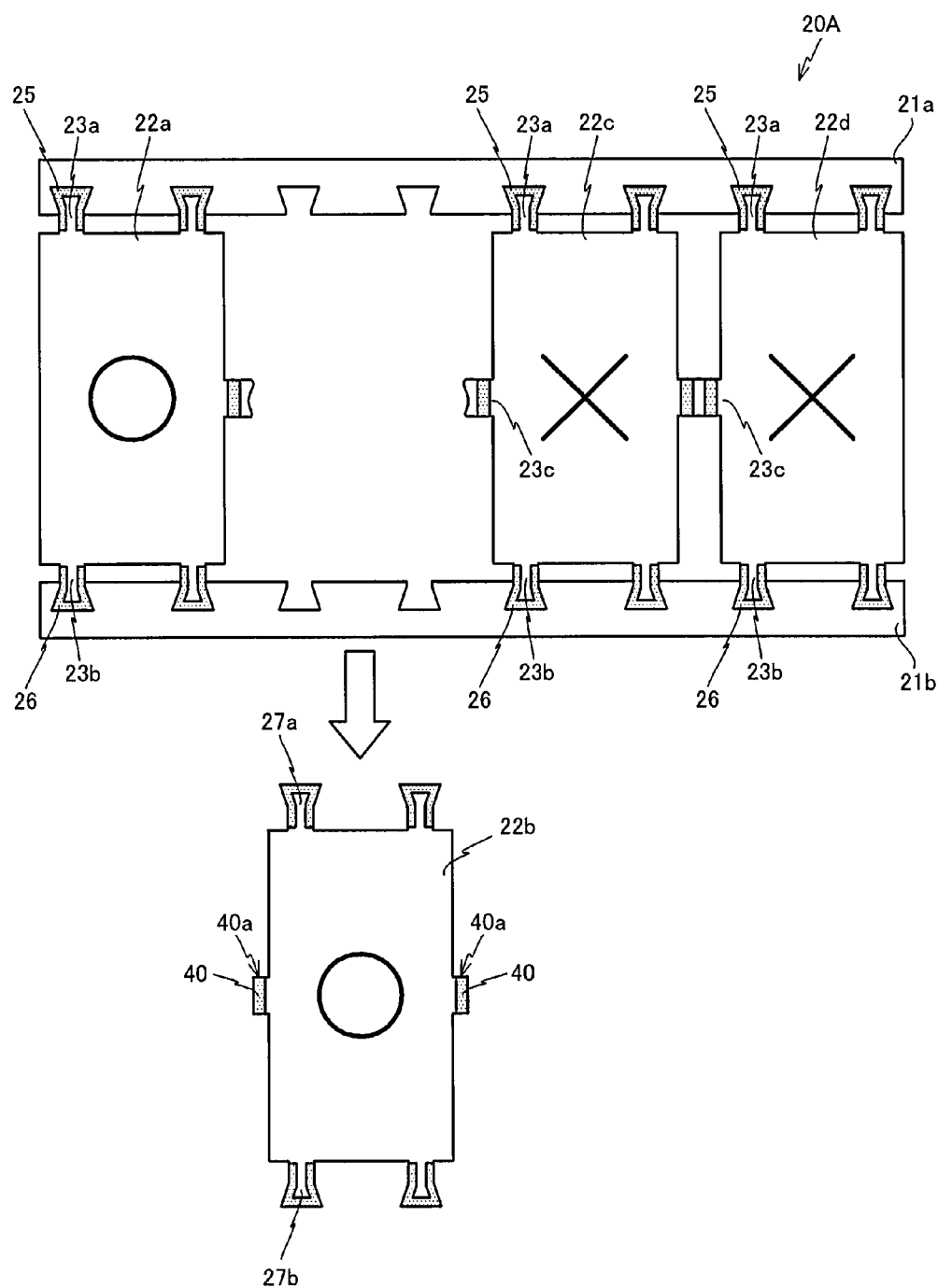
FIG. 20 is a view illustrating a process for detaching a piece substrate from a multi-piece substrate.

When piece substrate (22b) is detached from multi-piece substrate (20A), protrusion (40a) with remaining conductive pattern 40 is formed on each side of piece substrate (22b) as shown in FIG. 20.

Piece substrate (32b) is detached from multi-piece substrate (30A). When detaching piece substrate (32b), piece substrate (32b) is detached from piece substrates (32a, 32c) in such a way that conductive patterns 41 will remain on piece substrates (32a, 32c) positioned on both sides of piece substrate (32b) as shown in FIG. 21.

In particular, as arrows in FIG. 19 show, a laser beam is moved relative to multi-piece substrate (30A) so that, of the edges of conductive pattern 40, the beam spot of the laser beam moves along the edge of the conductive pattern 40 that is positioned closer to piece substrate (32b). Accordingly, the beam spot of the laser beam moves along the arrows in FIG. 19, and piece substrate (32b) is detached from piece substrates (32a, 32c) positioned on both of its sides.

Figure 21:
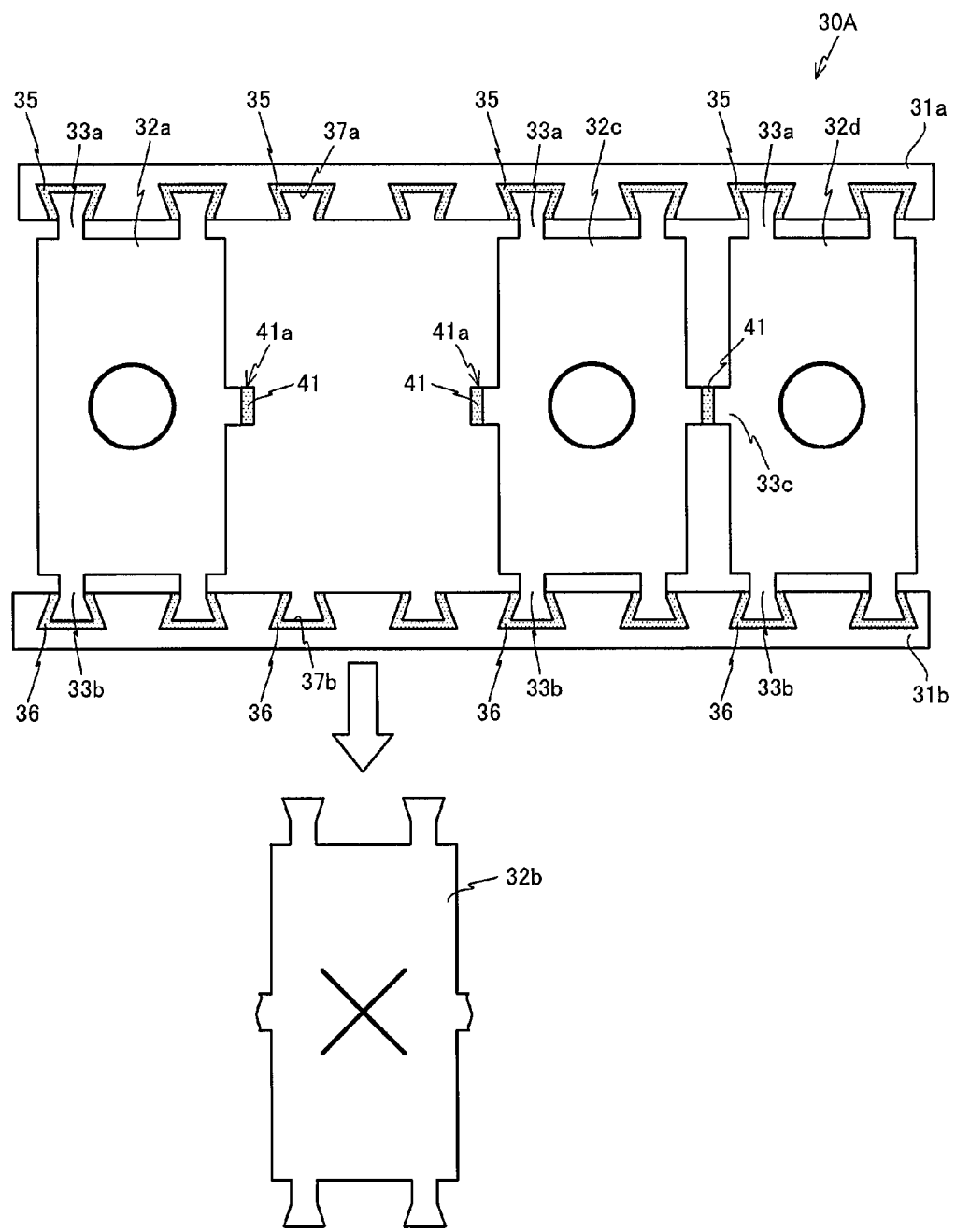
FIG. 21 is a view illustrating a process for detaching a piece substrate from a multi-piece substrate.

As shown in FIG. 21, when piece substrate (32b) is detached from multi-piece substrate (30A), protrusion (41a) with remaining conductive pattern 41 is formed on each of piece substrates (32a, 32c), which were positioned on both sides of piece substrate (32b).

Figure 22:
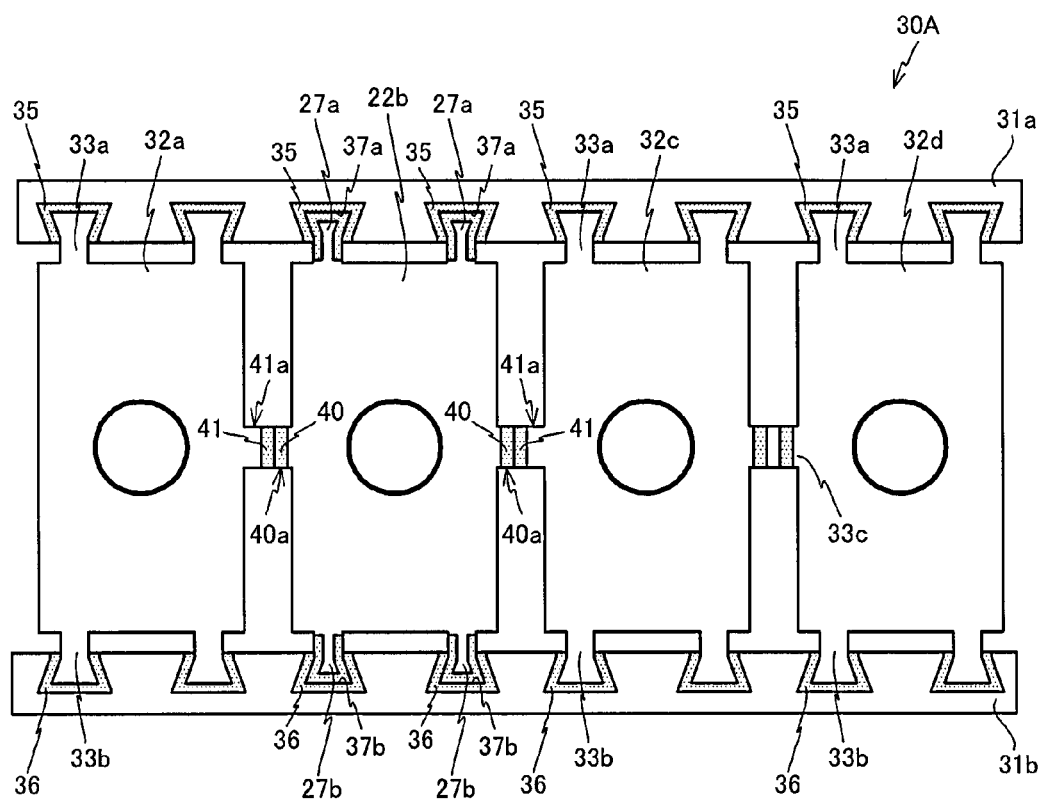
FIG. 22 is a view illustrating a process for fitting a piece substrate into a multi-piece substrate.

As shown in FIG. 22, piece substrate (22b) detached from multi-piece substrate (20A) is fitted into multi-piece substrate (30A). In particular, piece substrate (22b) is pushed between two piece substrates (32a, 32b) so that joints (27a, 27b) of piece substrate (22b) are fitted respectively into recesses (37a, 37b) formed in frames (31a, 31b). Then, a pair of protrusions (40a) of piece substrate (22b) are set to be in contact with protrusions (41a) of piece substrates (32a, 32c) respectively.

Joints (27a, 27b) of piece substrate (22b) are respectively adhered to frames (31a, 31b) while protrusions (40a) of piece substrate (22b) are adhered to protrusions (41a) of piece substrates (32a, 32c). Accordingly, a multi-piece substrate formed only with good piece substrates is completed.

As described so far, good piece substrates are attached to each other by connecting protrusions (40a, 41a) in the present embodiment. Therefore, piece substrates are aligned accurately with each other.

Figure 23:
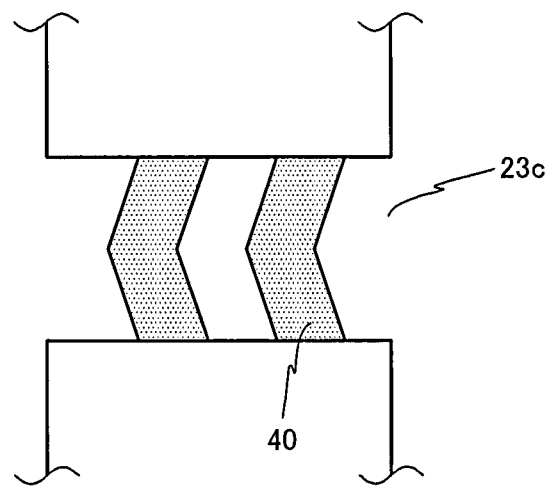
FIG. 23 is a view showing a modified example of a conductive pattern.
Figure 24:
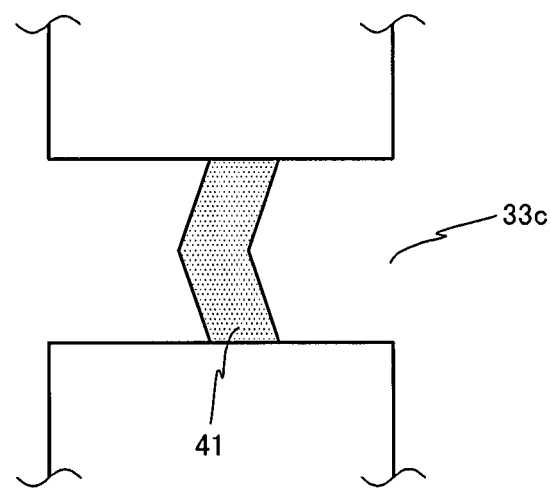
FIG. 24 is a view showing another modified example of a conductive pattern.

In the present embodiment, an example has been described in which conductive patterns 40 formed on connectors (23c) of multi-piece substrate (20A) and conductive patterns 41 formed on connectors (33c) of multi-piece substrate (30A) are rectangular. However, that is not the only option, and conductive patterns (40, 41) may be shaped in any other shape than rectangles as shown in FIGS. 23 and 24, for example. By setting such shapes, protrusions (40a, 41a) are also fitted to each other.

Figure 25:
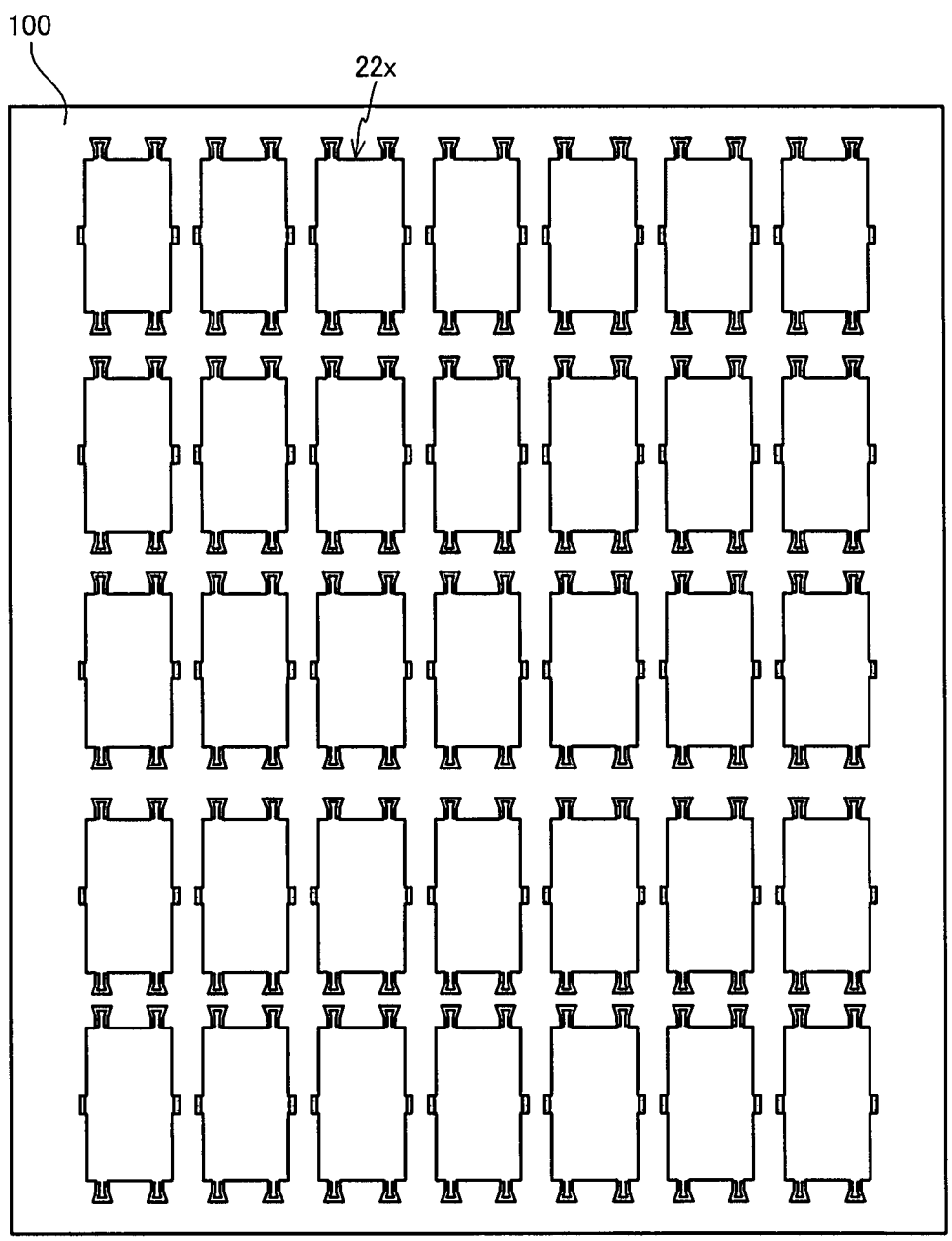
FIG. 25 is a view showing multi-piece substrates formed on a work.

In the present embodiment, an example has been described in which good piece substrate (22b) detached from multi-piece substrate (20A) is replaced with piece substrate (32b) of multi-piece substrate (30A). However, that is not the only option. As shown in FIG. 25, for example, piece substrate (22x) corresponding to piece substrate (22b) may also be formed on work 100. When a defect is found in any of piece substrates (32a~32d) of multi-piece substrate (30A), piece substrate (22x) is detached to be replaced with a piece substrate of multi-piece substrate (30A) so that a multi-piece substrate is formed only with good piece substrates.

In the present embodiment, an example has been described in which each of piece substrates (22a~22d) is connected to frames (21a, 21b) in multi-piece substrate (20A), and each of piece substrates (32a~32d) is connected to frames (31a, 31b) in multi-piece substrate (30A) as shown in FIGS. 18 and 19. However, that is not the only option, and a multi-piece substrate may be structured only with piece substrates (22a~22d) connected to each other. Also, a multi-piece substrate may be structured only with piece substrates (32a~32d) connected to each other.

So far, embodiments of the present invention have been described. However, the present invention is not limited to the above embodiments.

For example, examples have been described in the embodiments above in which good piece substrate (22b) detached from multi-piece substrate 20 is attached to multi-piece substrate 30 so that multi-piece substrate 10 is formed where all substrates are good. However, that is not the only option, and the detached piece substrate may be attached to a frame manufactured separately.

Figure 26:
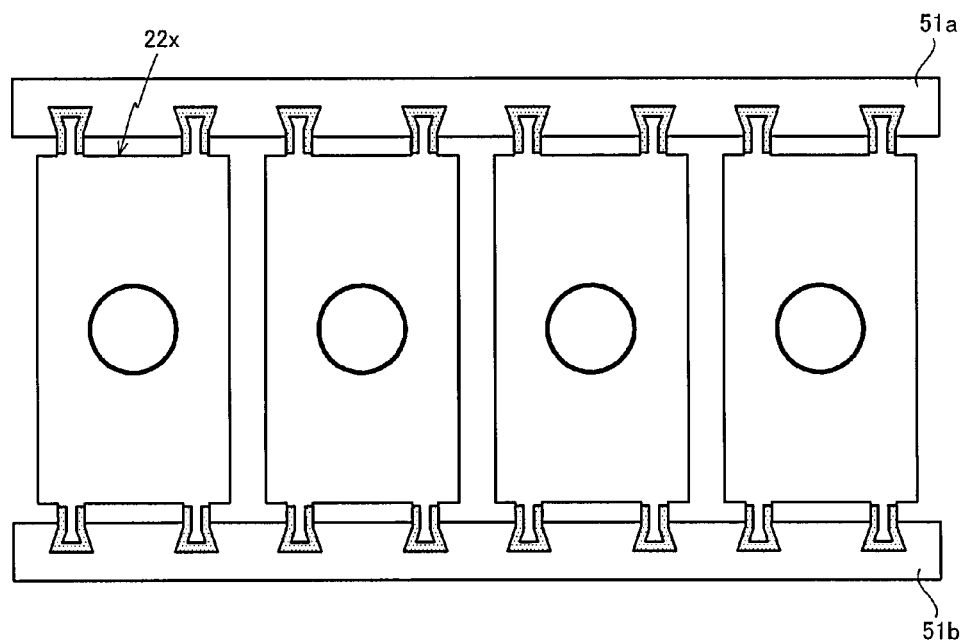
FIG. 26 is a view showing a modified example of a frame.
Figure 27:
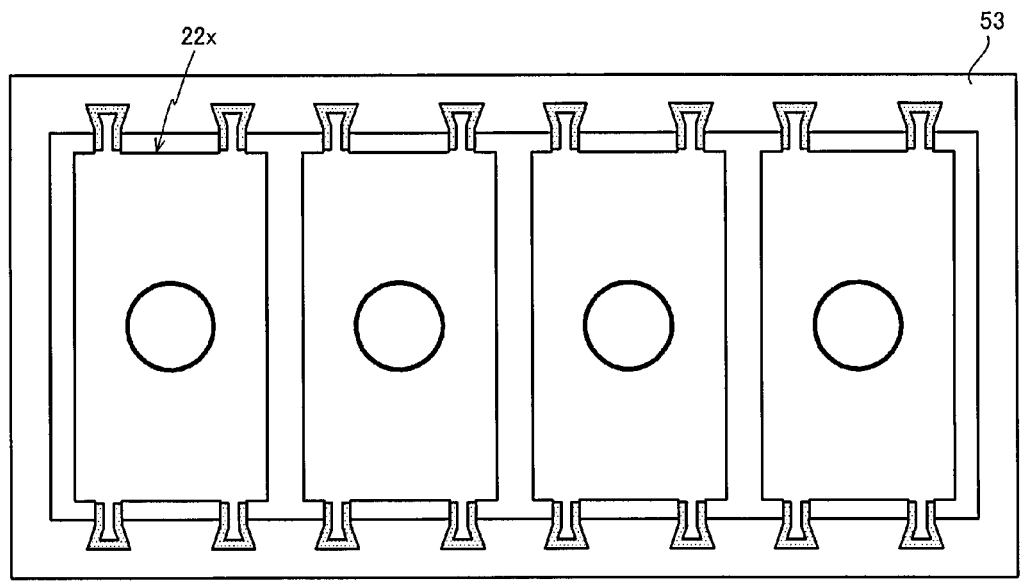
FIG. 27 is a view showing another modified example of a frame.

For example, as shown in FIG. 26, it is an option for good piece substrate (22x) detached from multi-piece substrate 20 to be attached to a pair of frames (51a, 51b) manufactured separately so that a multi-piece substrate is formed. Also, as shown in FIG. 27, it is another option for good piece substrate (22x) detached from multi-piece substrate 20 to be attached to a single frame 53 manufactured separately so that a multi-piece substrate is formed.

Figure 28:
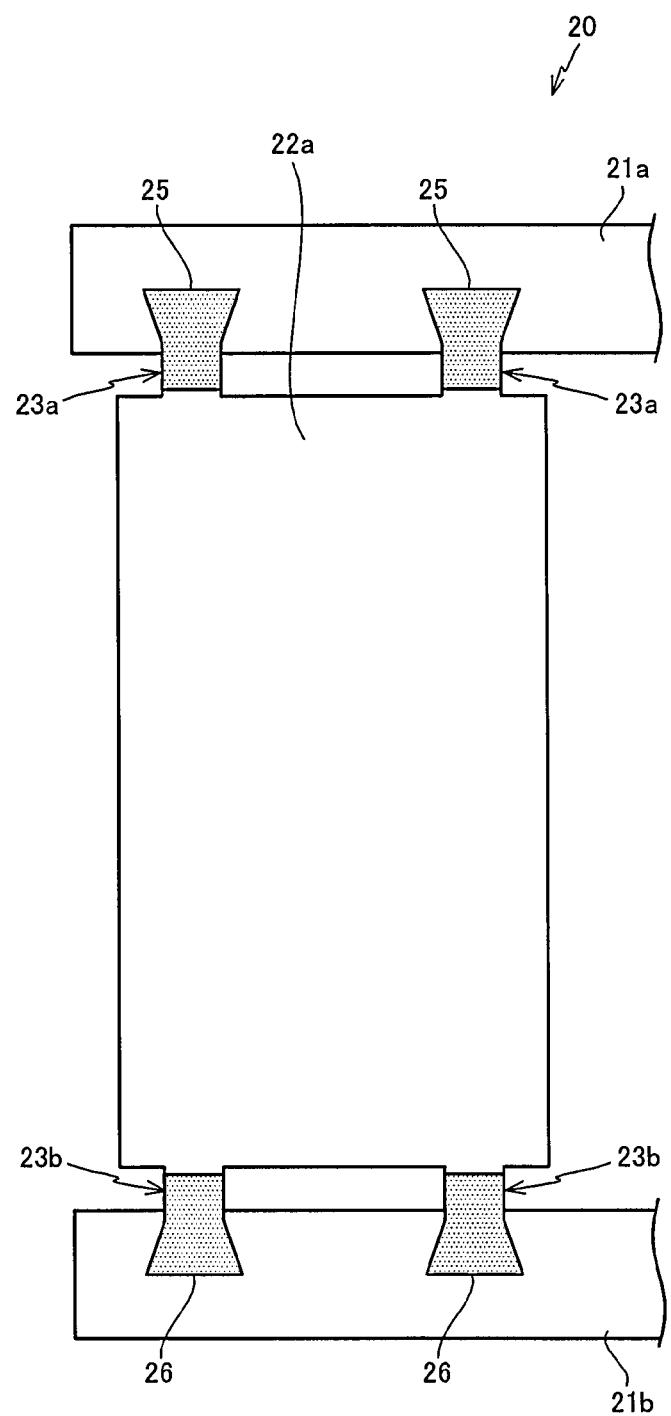
FIG. 28 is a view showing yet another modified example of a conductive pattern formed on a piece substrate.

In the embodiments described above, examples have been described in which conductive patterns (25, 26), which edge joints (27a, 27b) of piece substrates (22a~22d) of multi-piece substrate 20, are U-shaped. However, that is not the only option, and the shapes of conductive patterns (25, 26) may be determined freely. For example, as shown in FIG. 28, conductive patterns (25, 26) may be shaped to fully cover supports (23a, 23b) which connect frames (21a, 21b) and piece substrate (22a).

Figure 29:
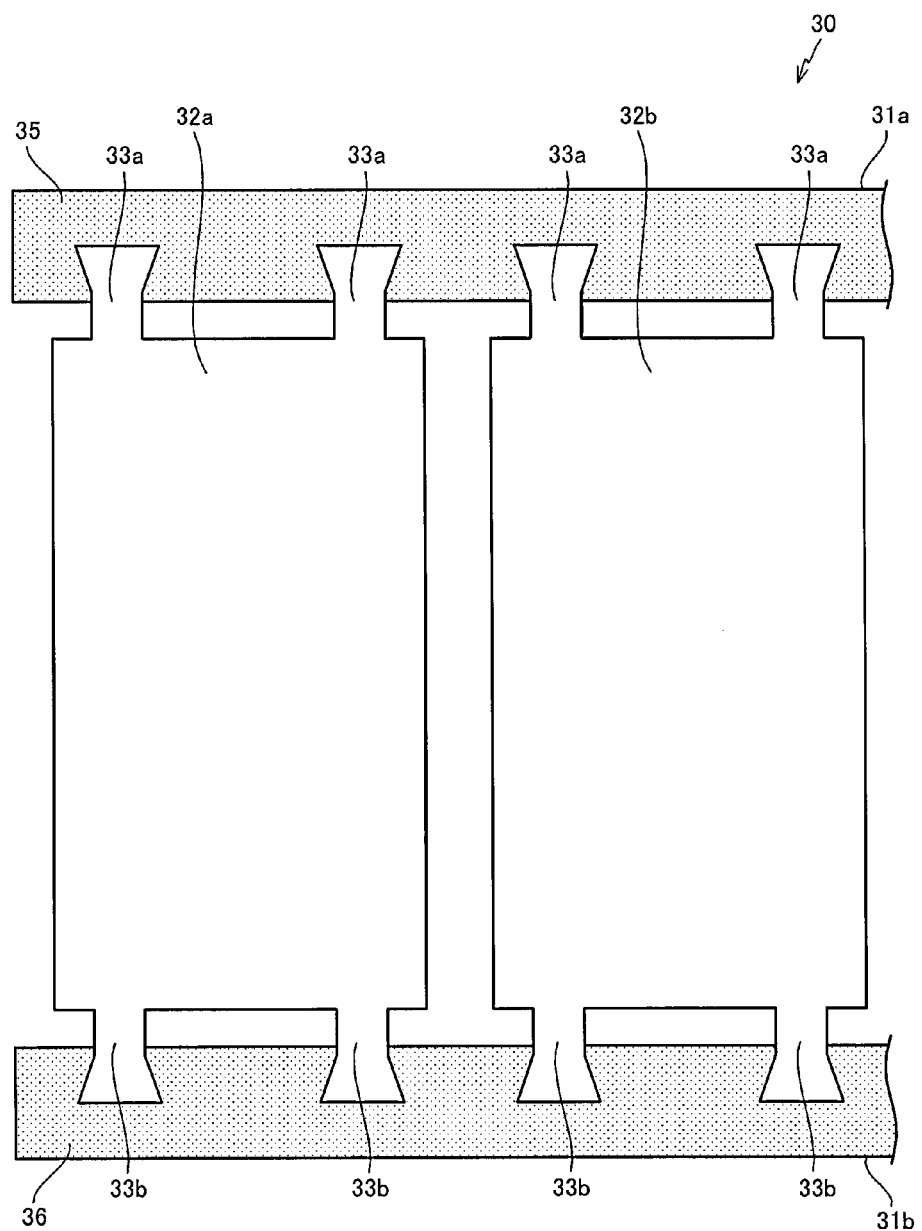
FIG. 29 is a view showing yet another modified example of a conductive pattern formed on the frame.

In the embodiments described above, examples have been described in which conductive patterns (35, 36), which edge recesses (37a, 37b) formed in frames (31a, 31b) of multi-piece substrate 30, are U-shaped. However, that is not the only option, and the shapes of conductive patterns (35, 36) may be determined freely. For example, as shown in FIG. 29, conductive patterns (35, 36) may be shaped to cover substantially the entire frames (31a, 31b).

Figure 30:
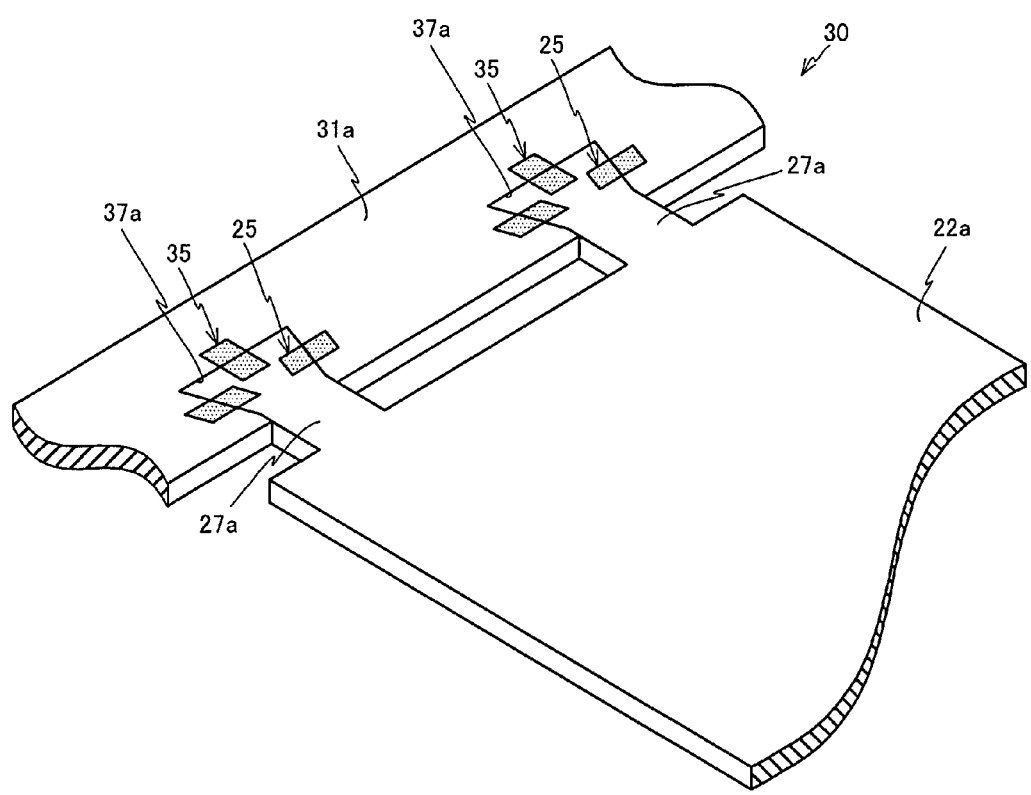
FIG. 30 is a view showing yet another modified example of a conductive pattern.

In the embodiments above, examples have been described in which conductive pattern 25 is formed along the entire periphery of joint (27a) of piece substrate (22a) and conductive pattern 35 is formed along the entire periphery of recess (37a) in frame (31a), as shown in FIG. 15, for example. However, that is not the only option. For example, as shown in FIG. 30, conductive pattern 25 made up of multiple sectional patterns may be formed along the periphery of joint (27a) of piece substrate (22a). Also, conductive pattern 35 made up of multiple sectional patterns may be formed along the periphery of recess (37a) of frame (31a).

As shown in FIG. 30, positions of the sectional patterns formed on joint (27a) correspond to positions of sectional patterns formed on frame (31a). Accordingly, the positional relationship of joint (27a) of piece substrate (22a) and recess (37a) formed in frame (31a) is accurately determined. As a result, frame (31a) and piece substrate (22a) are accurately aligned.

In the embodiments above, examples have been described in which piece substrates (22a~22d) and frames (31a, 31b) are adhered by an adhesive filled between the inner-wall surfaces of joints (27a, 27b) formed for piece substrates (22a~22d) and recesses (37a, 37b) formed in frames (31a, 31b). However, that is not the only option. For example, as shown in FIG. 31, it is an option to form recess 60 to cover joint (27a) of piece substrate (22a) and frame (31a), and to fill an adhesive in such recess 60 so that piece substrate (22a) and frame (31a) are adhered.

Figure 31:
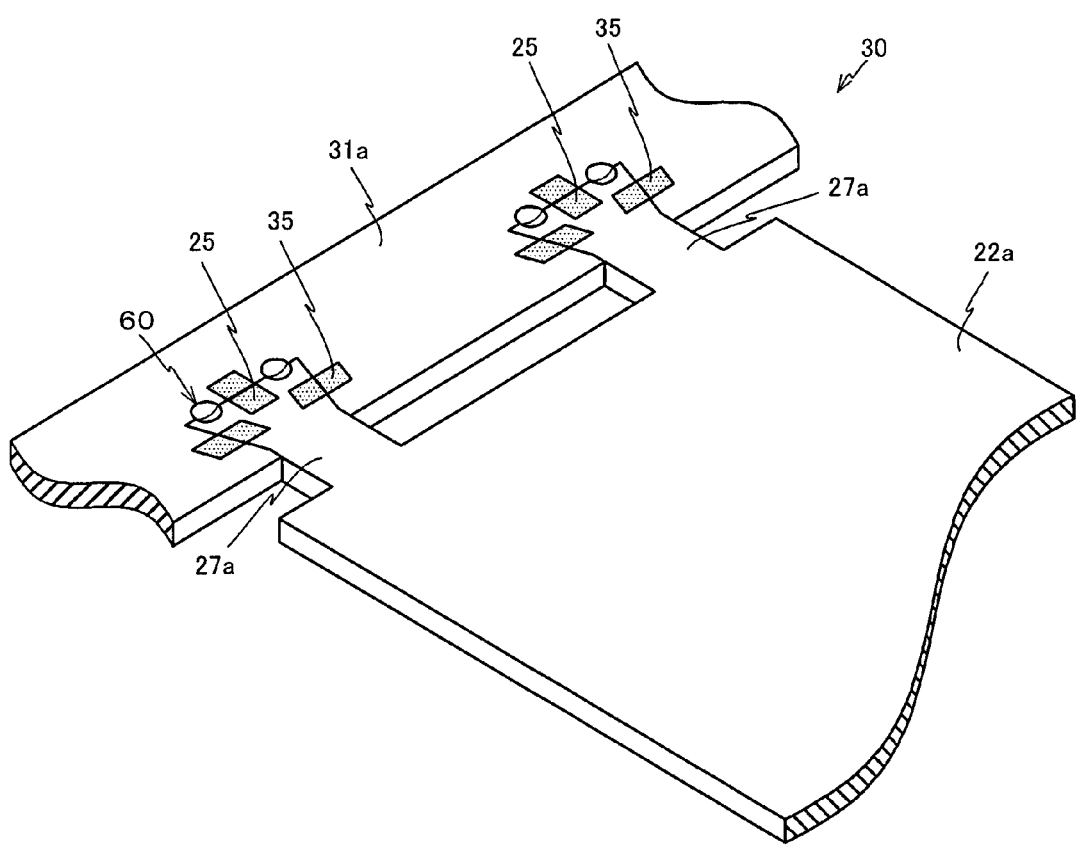
FIG. 31 is a view illustrating a procedure for adhering a frame and a piece substrate.
Figure 32:
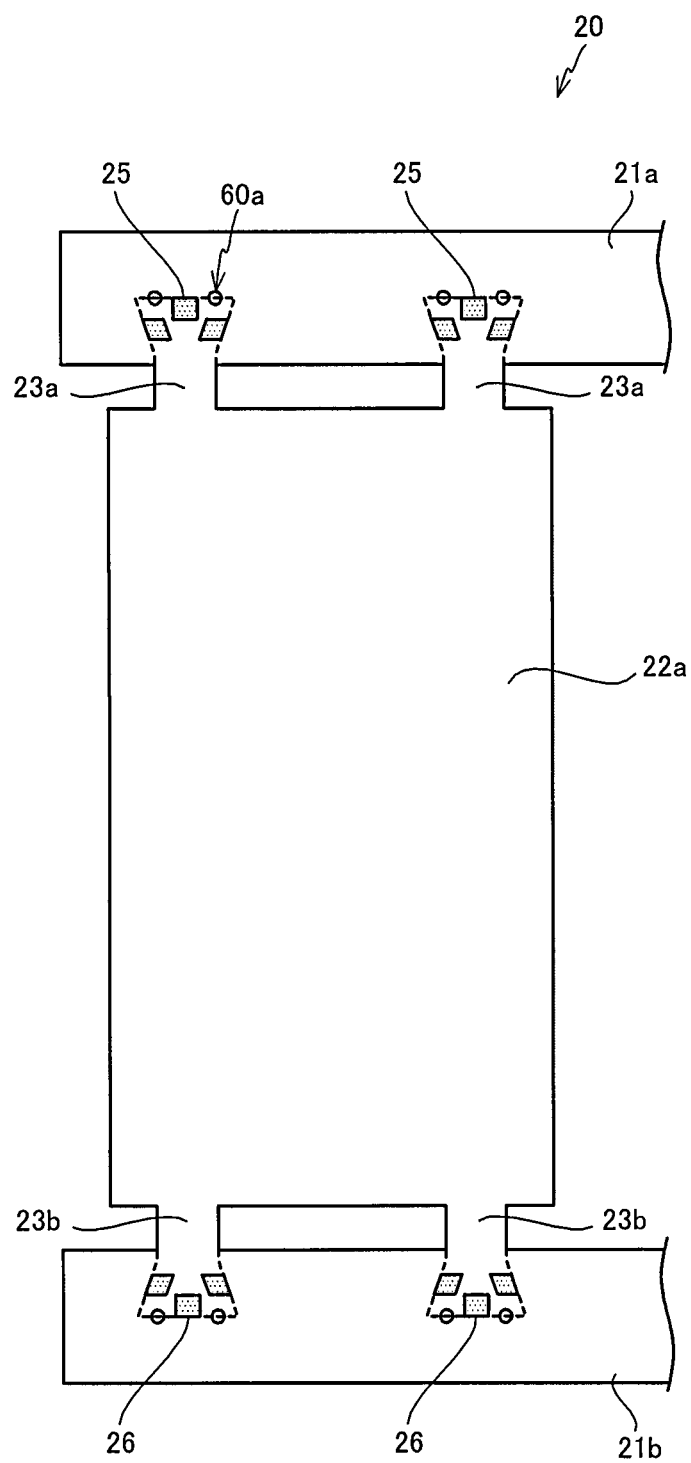
FIG. 32 is a view showing recesses formed in a multi-piece substrate.
Figure 33:
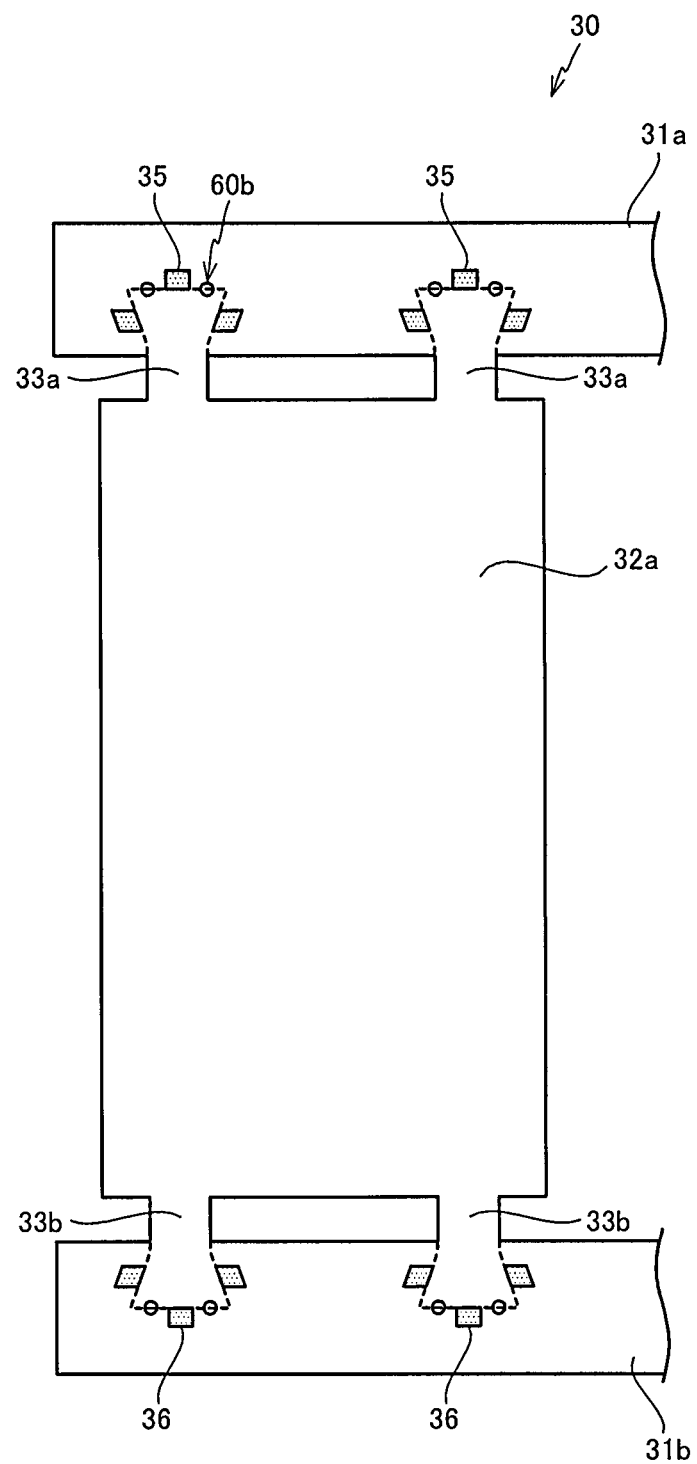
FIG. 33 is a view showing recesses formed in a multi-piece substrate.

Such recess 60 may be formed by a drill or the like, for example, after piece substrate (22a) is fitted into frame (31a), as shown in FIG. 31. Alternatively, as shown in FIG. 32, recesses (60a) are formed in advance prior to detaching piece substrates (22a~22d) from frames (21a, 21b) of multi-piece substrate 20. Likewise, as shown in FIG. 33, recesses (60b) are formed in advance prior to detaching piece substrates (32a~32d) from frames (31a, 31b) of multi-piece substrate 30. Then, by fitting piece substrates (22a~22d) into frames (31a, 31b), recesses 60 shown in FIG. 31 are formed from portions of recesses (60a) formed in piece substrates (22a~22d) and portions of recesses (60b) formed in frames (31a, 31b).

Figure 34:
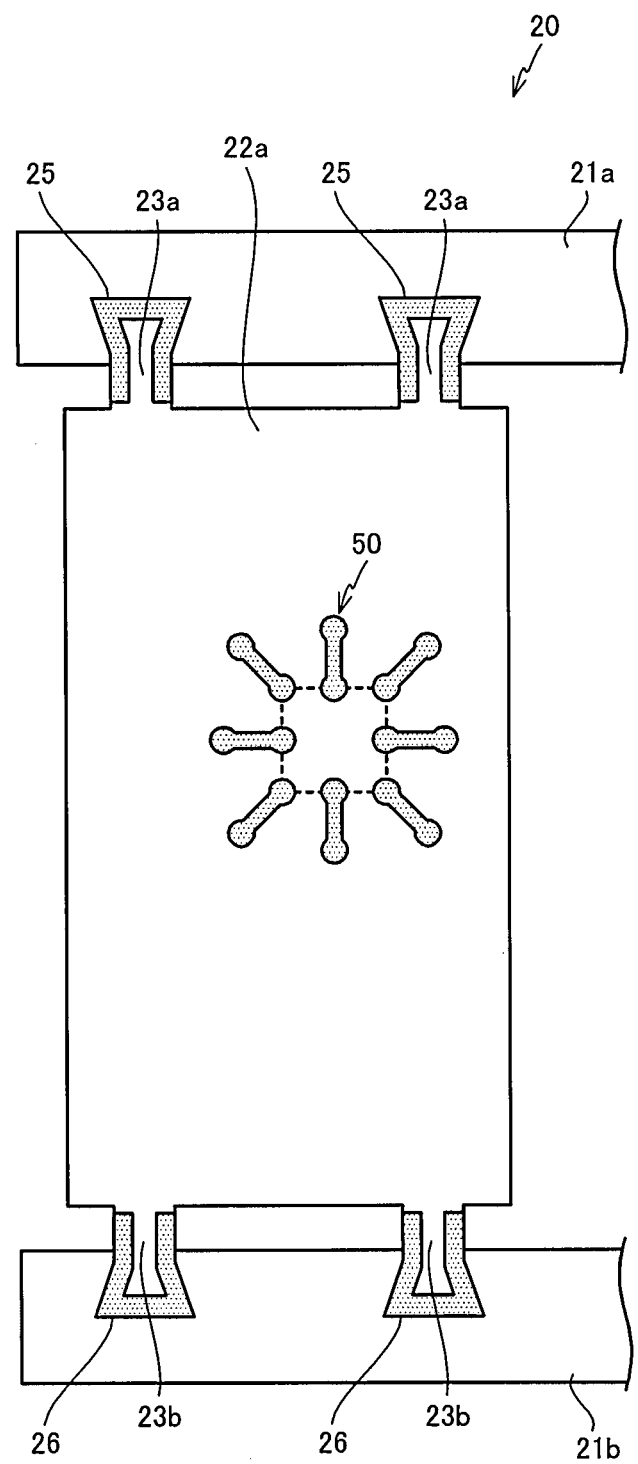
FIG. 34 is a view showing conductive patterns formed on a piece substrate.

In the embodiments above, examples have been described in which conductive patterns (25, 26, 35, 36) which edge joints or recesses are formed on the upper surfaces of piece substrates. However, that is not the only option. In addition to conductive patterns (25, 26, 35, 36), conductive pattern 50 may also be formed on a piece substrate, as shown in FIG. 34, for example. Such conductive pattern 50 includes a pad for electrical connection with an electronic component to be mounted on piece substrate (22a). Conductive patterns (25, 26, 35, 36, 50) are formed on surfaces of multi-piece substrates (20, 30) at the same time, for example. The following is a description with reference to the drawings.

Figure 35:
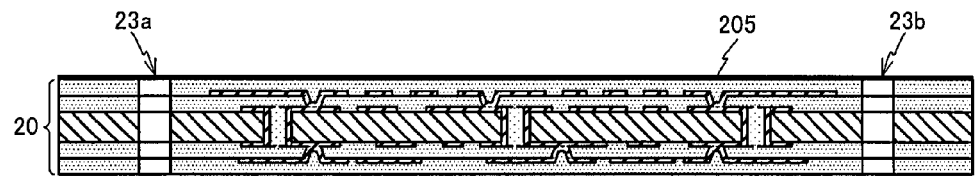
FIG. 35 is a view illustrating a method for forming conductive patterns.

First, a catalyst mainly containing Pd or the like is applied on a surface of multi-piece substrate 20 before conductive patterns are formed on the surface. Accordingly, the catalyst is adsorbed on the surface of multi-piece substrate 20. Multi-piece substrate 20 is immersed in an electroless copper plating solution. In doing so, electroless plated film 205 is formed on the surface of multi-piece substrate 20, as shown in FIG. 35.

Figure 36:
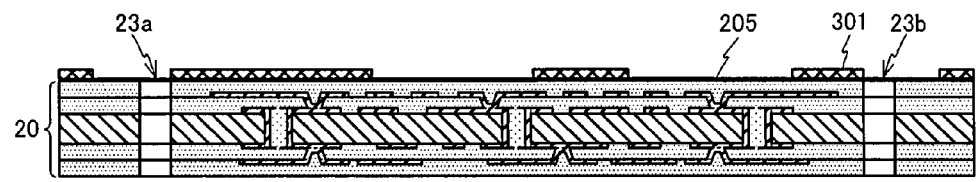
FIG. 36 is a view illustrating a method for forming conductive patterns.

Photosensitive dry film 301 is laminated on a surface of electroless plated film 205. Then, a mask film with a predetermined pattern is adhered to photosensitive dry film 301, which is then exposed to UV rays. Photosensitive dry film 301 is developed using an alkaline solution. In doing so, patterned photosensitive dry film 301 is formed on the surface of multi-piece substrate 20, as shown in FIG. 36.

Figure 37:
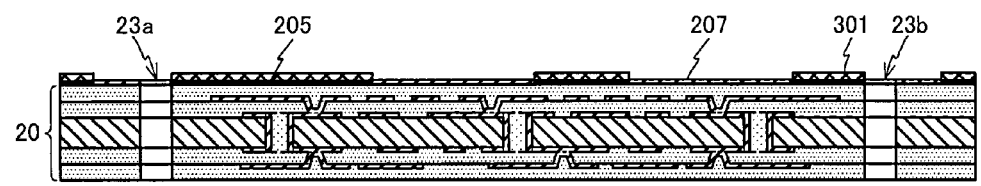
FIG. 37 is a view illustrating a method for forming conductive patterns.

Photosensitive dry film 301 is washed with water and dried. Then, electrolytic copper plating is performed on electroless plated film 205 exposed from photosensitive dry film 301. Accordingly, as shown in FIG. 37, plated film 207 is formed on electroless plated film exposed from photosensitive dry film 301.

Figure 38:
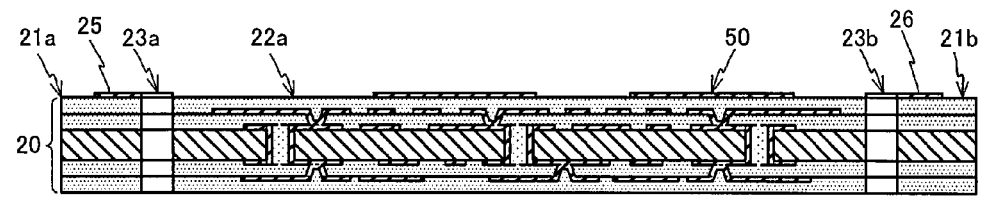
FIG. 38 is a view illustrating a method for forming conductive patterns.

Photosensitive dry film 301 is removed, and surfaces of multi-piece substrate 20 and plated film 207 are washed with water and dried. Then, electroless plated film 205 covered by photosensitive dry film 301 is removed through etching. In doing so, conductive patterns (25, 26, 50) are formed on the surface of multi-piece substrate 20, as shown in FIG. 38.

As described above, when conductive patterns (25, 26, 50) are formed at the same time on the same surface, relative positional shifting is reduced between conductive patterns (25, 26) and conductive pattern 50 which forms part of the circuits to be connected to an electronic component. As a result, positions of joints (27a, 27b) formed by detaching piece substrates (22a~22d) along conductive patterns (25, 26) are less likely to be shifted from the position of conductive pattern 50. Accordingly, when piece substrates (22a~22d) are fitted into frames (31a, 31b) as shown in FIG. 1, for example, there will be less positional shifting between electronic components mounted on piece substrates (22a~22d) and electronic components mounted on piece substrates (32a~32d). Therefore, processes such as etching and exposure to light are conducted accurately on multi-piece substrate 10.

Forming conductive patterns (25, 26, 50) is not limited to the process described above. Using a subtractive method, for example, conductive patterns may be formed by performing panel plating on surfaces of multi-piece substrates 20 and 30 to form plated films, and then by etching such plated films.

In the embodiments above, examples have been described in which each of piece substrates (22a~22d) is connected to frames (31a, 31b) using four joints (27a, 27b). However, that is not the only option, and three or fewer joints or five or more joints may be formed for each of piece substrates (22a~22d).

In the embodiments above, a UV-curable adhesive was used to adhere frames (31a, 31b) and piece substrate (22a). However, that is not the only option, and a thermosetting adhesive may also be used for adhering frames (31a, 31b) and piece substrate (22a). Alternatively, two or more kinds of adhesives may be used. For example, it is an option to use a photocurable adhesive or acrylic adhesive for adhesion (preliminary adhesion), and then to use a thermosetting adhesive for reinforcement.

In the embodiments above, examples have been described in which recesses (37a, 37b) are formed in frames (31a, 31b) of multi-piece substrate 30, and joints (27a) are formed for piece substrate (22a). However, that is not the only option. Recesses may be formed in piece substrate (22a) to be attached to multi-piece substrate 30, and for frames (31a, 31b) of multi-piece substrate 30, joints may be formed to be fitted in the recesses in piece substrate (22a).

The steps in the embodiments above are not limited to the order shown in the flowcharts. The order may be modified within a scope that does not deviate from the gist of the present invention. Also, any step may be omitted depending on usage requirements or the like.

In the embodiments above, multi-piece substrate 20 and multi-piece substrate 30 each have two rectangular frames. However, the shape of the frames is not limited to being rectangular. It may be a shape surrounding piece substrates. Also, it may be circular or oval.

In the embodiments above, frames (21a, 21b) and piece substrates (22a~22d) of multi-piece substrate 20 are made of the same material. Also, frames (31a, 31b) and piece substrates (32a~32d) of multi-piece substrate 30 are made of the same material. However, that is not the only option. The frames and piece substrates of a multi-piece substrate may be formed using different materials from each other. For example, frames may be formed using only insulative material.

In the embodiments above, the number of insulation layers in frames (21a, 21b) is the same as the number of insulation layers in piece substrate (22a) as shown in FIG. 38, for example. However, that is not the only option, and the number of insulation layers in frames (21a, 21b) may be different from the number of insulation layers in piece substrate (22a). Likewise, the number of conductive layers in frames (21a, 21b) may be the same as or different from the number of conductive layers in piece substrate (22a).

Figure 39:
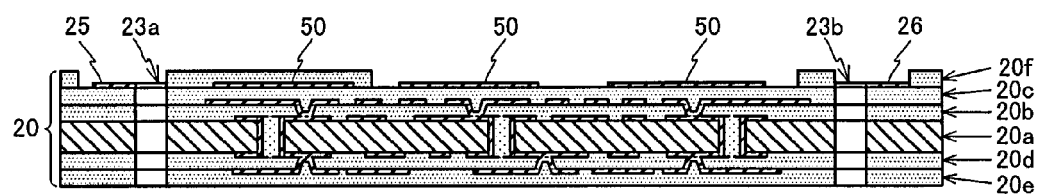
FIG. 39 is a view showing a modified example of a multi-piece substrate.

In the embodiments above, conductive patterns (25, 26, 35, 36, 50) are formed on a surface of the outermost layer of a piece substrate or a frame. However, that is not the only option. For example, as shown in FIG. 39, conductive patterns (25, 26, 35, 36, 50) or the like are not always required to be formed on the outermost layer. For example, insulation layer (20f) may be formed on surfaces of conductive patterns.

Alternatively, conductive patterns (25, 26, 35, 36, 50) may be formed on surfaces of base substrate (20a), or on surfaces of insulation layers (20b~20e) laminated on base substrate (20a).

In the embodiments above, piece substrates (22a~22d, 32a~32d) are rigid wiring boards made of insulation layers and conductive layers. However, the structure of piece substrates is not limited to such, and they may each be a wiring board made by alternately laminating wiring layers and insulation layers on a ceramic substrate.

Piece substrates (22a~22d, 32a~32d) are not limited to rigid wiring boards, and they may be flexible wiring boards, flex-rigid wiring boards or the like. Also, the shape of piece substrates (22a~22d, 32a~32d) may be determined freely; for example, it may be a parallelogram, a circle, an oval, or the like.

In the embodiments above, examples are described in which piece substrates (22a~22d, 32a~32d) are formed with interlayer insulation layers and conductive patterns. However, that is not the only option. Piece substrates (22a~22d, 32a~32d) may each be a substrate with a built-in electronic component where a component is built into a base substrate.

In the examples above, multi-piece substrate 10 is pressed using pressing device 305 as shown in FIG. 16, for example. However, that is not the only option, and a multi-piece substrate may be pressed using a roller pressing device or the like.

A method for manufacturing a multi-piece substrate according to the first aspect of the present invention includes the following: preparing a first frame having a connecting portion to which a first piece substrate is to be connected; on the first piece substrate connected to a second frame different from the first frame, forming a conductive pattern whose contour at the connected portion with the second frame corresponds to the periphery of the connecting portion of the first frame; by irradiating a laser beam at the boundary between the second frame and the conductive pattern on the first piece substrate, detaching the first piece substrate from the second frame; and into the connecting portion of the first frame, fitting a joint formed for the first piece substrate when detached from the second frame.

A method for manufacturing a multi-piece substrate according to the second aspect of the present invention includes the following: preparing a second piece substrate having a connecting portion to which a first piece substrate is to be connected; on a first connector connecting the first piece substrates to each other, forming a first conductive pattern whose contour corresponds to the periphery of the connecting portion; by irradiating a laser beam at the boundary of the first conductive pattern and the first connector, detaching the first piece substrates from each other; and into the connecting portion of the second piece substrate, fitting a joint for the first piece substrate formed when the first piece substrate was detached.

A multi-piece substrate according to the third aspect of the present invention has the following: a first frame having a connecting portion; and a first piece substrate detached from a second frame different from the first frame. In such a multi-piece substrate, a conductive pattern is formed on the periphery of a joint of the first piece substrate, which is fitted into the connecting portion of the first frame and whose contour corresponds to the periphery of the connecting portion formed in the first frame.

A multi-piece substrate according to the fourth aspect of the present invention has the following: a second piece substrate having a connecting portion to which a first piece substrate is connected; and a first piece substrate whose joint is fitted into the connecting portion. In such a multi-piece substrate, the joint is formed by detaching from each other the first piece substrates connected by a first connector along the boundary of a first conductive pattern, which is formed on the first connector and whose contour corresponds to the periphery of the connecting portion.

According to an embodiment of the present invention, a connection portion is detached along the periphery of a conductive pattern when a piece substrate is detached from the frame or from another piece substrate, thus reducing processing errors that occur while the piece substrate is being detached.

Obviously, numerous modifications and variations of the present invention are possible in light of the above teachings. It is therefore to be understood that within the scope of the appended claims, the invention may be practiced otherwise than as specifically described herein.

What is claimed is:

1. A multi-piece substrate, comprising:
a first frame having a connecting portion; and
a first piece substrate having a joint portion engaged with the connecting portion of the first frame and a joint conductive pattern formed on a periphery portion of the joint portion of the first piece substrate such that the joint conductive pattern formed on the periphery portion of the joint portion is positioned only along the periphery of the joint portion of the first piece substrate,
wherein the joint portion of the first piece substrate is fitted into the connecting portion of the first frame and has a contour corresponding to periphery of the connecting portion of the first frame.

2. The multi-piece substrate according to claim 1, wherein the joint conductive pattern has a plurality of sectional patterns such that the plurality of sectional patterns forms a contour corresponding to the periphery of the connecting portion of the first frame, respectively.

3. The multi-piece substrate according to claim 1, wherein the connecting portion of the first frame has a frame conductive pattern formed on the periphery of the connecting portion, and the periphery of the connecting portion has a contour corresponding to the periphery of the joint portion of the first piece substrate.

4. The multi-piece substrate according to claim 1, wherein the first piece substrate has a first protrusion portion configured to be in contact with a second protrusion portion of a second piece substrate, the first protrusion portion has a first conductive pattern formed along a boundary of the first protrusion portion and the second protrusion portion when the first protrusion portion and the second protrusion portion are in contact, and the second protrusion portion has a second conductive pattern formed along the boundary of the first protrusion portion and the second protrusion portion.

5. The multi-piece substrate according to claim 1, wherein the first piece substrate has a pad conductive pattern having a pad configured to connect to an electronic component.

6. the multi-piece substrate according to claim 1, wherein the joint conductive pattern formed on the first piece substrate is formed on a surface of the first piece substrate.

7. The multi-piece substrate according to claim 1, wherein the joint portion of the first piece substrate is protruding in a side direction of the first piece substrate.

8. The multi-piece substrate according to claim 1, wherein the joint portion of the first piece substrate is engaged with the connecting portion of the first frame such that the joint portion of the first piece substrate forms a surface substantially leveled with respect to a surface of the first frame.

9. The multi-piece substrate according to claim 1, wherein the first frame has a recess portion such that the recess portion is forming the connecting portion along a periphery of the recess portion, and the joint portion of the first piece substrate has a thickness substantially equal to a thickness of the first frame such that the joint portion of the first piece substrate is engaged with the connecting portion of the first frame to form a surface substantially leveled with respect to a surface of the first frame.

10. The multi-piece substrate according to claim 2, wherein the connecting portion of the first frame has a frame conductive pattern formed on the periphery of the connecting portion, and the periphery of the connecting portion has a contour corresponding to the periphery of the joint portion of the first piece substrate.

11. The multi-piece substrate according to claim 2, wherein the first piece substrate has a first protrusion portion configured to be in contact with a second protrusion portion of a second piece substrate, the first protrusion portion has a first conductive pattern formed along a boundary of the first protrusion portion and the second protrusion portion when the first protrusion portion and the second protrusion portion are in contact, and the second protrusion portion has a second conductive pattern formed along the boundary of the first protrusion portion and the second protrusion portion.

12. The multi-piece substrate according to claim 2, wherein the first piece substrate has a pad conductive pattern having a pad configured to connect to an electronic component.

13. The multi-piece substrate according to claim 2, wherein the joint conductive pattern formed on the first piece substrate is formed on a surface of the first piece substrate.

14. The multi-piece substrate according to claim 2, wherein the joint portion of the first piece substrate is protruding in a side direction of the first piece substrate.

15. The multi-piece substrate according to claim 2, wherein the joint portion of the first piece substrate is engaged with the connecting portion of the first frame such that the joint portion of the first piece substrate forms a surface substantially leveled with respect to a surface of the first frame.

16. The multi-piece substrate according to claim 2, wherein the first frame has a recess portion such that the recess portion is forming the connecting portion along a periphery of the recess portion, and the joint portion of the first piece substrate has a thickness substantially equal to a thickness of the first frame such that the joint portion of the first piece substrate is engaged with the connecting portion of the first frame to form a surface substantially leveled with respect to a surface of the first frame.

17. The multi-piece substrate according to claim 3, wherein the first piece substrate has a first protrusion portion configured to be in contact with a second protrusion portion of a second piece substrate, the first protrusion portion has a first conductive pattern formed along a boundary of the first protrusion portion and the second protrusion portion when the first protrusion portion and the second protrusion portion are in contact, and the second protrusion portion has a second conductive pattern formed along the boundary of the first protrusion portion and the second protrusion portion.

18. The multi-piece substrate according to claim 3, wherein the first piece substrate has a pad conductive pattern having a pad configured to connect to an electronic component.

19. A multi-piece substrate, comprising:
a first piece substrate; and
a second piece substrate having a connecting portion to which the first piece substrate is connected,
wherein the first piece substrate has a joint portion fitted into the connecting portion of the second piece substrate, and the joint portion of the first piece substrate has a first conductive pattern having a contour corresponding to a periphery of the connecting portion of the second piece substrate, and the joint portion of the first piece substrate comprises a detached portion of a first connector connecting the first piece substrate and another piece substrate.

20. The multi-piece substrate according to claim 19, wherein the connecting portion has a detached portion of a second connector connecting the second piece substrate and another piece substrate and has a second conductive pattern having a contour corresponding to periphery of the first conductive pattern.

* * * * *